United States Patent
Watabe et al.

(10) Patent No.: US 11,950,447 B2
(45) Date of Patent: Apr. 2, 2024

(54) LIGHT-EMITTING DEVICE, LIGHT-EMITTING APPARATUS, ELECTRONIC DEVICE, AND LIGHTING DEVICE

(71) Applicant: SEMICONDUCTOR ENERGY LABORATORY CO., LTD., Atsugi (JP)

(72) Inventors: Takeyoshi Watabe, Kanagawa (JP); Airi Ueda, Kanagawa (JP); Nobuharu Ohsawa, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 226 days.

(21) Appl. No.: 17/299,386

(22) PCT Filed: Nov. 27, 2019

(86) PCT No.: PCT/IB2019/060207
§ 371 (c)(1),
(2) Date: Jun. 3, 2021

(87) PCT Pub. No.: WO2020/121097
PCT Pub. Date: Jun. 18, 2020

(65) Prior Publication Data
US 2022/0029134 A1  Jan. 27, 2022

(30) Foreign Application Priority Data
Dec. 10, 2018 (JP) ................... 2018-230585

(51) Int. Cl.
*H01L 51/50* (2006.01)
*C09K 11/06* (2006.01)
(Continued)

(52) U.S. Cl.
CPC ............ *H10K 50/852* (2023.02); *C09K 11/06* (2013.01); *H10K 50/818* (2023.02);
(Continued)

(58) Field of Classification Search
None
See application file for complete search history.

(56) References Cited

U.S. PATENT DOCUMENTS 8,698,395 B2  4/2014  Im et al.
9,178,102 B2  11/2015  Fujita et al.
(Continued)

FOREIGN PATENT DOCUMENTS

| CN | 001797810 A | 7/2006 |
| CN | 103828485 A | 5/2014 |

(Continued)

OTHER PUBLICATIONS

International Search Report (Application No. PCT/IB2019/060207) dated Feb. 25, 2020.
(Continued)

*Primary Examiner* — Gregory D Clark
(74) *Attorney, Agent, or Firm* — Fish & Richardson P.C.

(57) ABSTRACT

A novel light-emitting device with a microcavity structure which can improve the emission efficiency compared to the conventional one is provided. In a light-emitting device with a microcavity structure that emits light in a near-infrared range, reflectance of one or both of a first electrode (reflective electrode) and a second electrode (semi-transmissive and semi-reflective electrode) with respect to light in a near-infrared range (e.g., light with a wavelength of 850 nm) is higher than the reflectance thereof with respect to light in a visible light range (greater than or equal to 400 nm and less than 750 nm).

19 Claims, 17 Drawing Sheets

(51) Int. Cl.
H10K 50/818 (2023.01)
H10K 50/828 (2023.01)
H10K 50/852 (2023.01)
H10K 50/858 (2023.01)
H10K 85/30 (2023.01)
H10K 85/60 (2023.01)
H10K 102/00 (2023.01)

(52) U.S. Cl.
CPC ......... H10K 50/828 (2023.02); H10K 50/858 (2023.02); C09K 2211/1044 (2013.01); C09K 2211/185 (2013.01); H10K 85/342 (2023.02); H10K 85/615 (2023.02); H10K 85/626 (2023.02); H10K 85/633 (2023.02); H10K 85/636 (2023.02); H10K 85/6572 (2023.02); H10K 85/6576 (2023.02); H10K 2102/3026 (2023.02); H10K 2102/351 (2023.02)

(56) References Cited

U.S. PATENT DOCUMENTS

| | | | |
|---|---|---|---|
| 9,412,909 | B2 | 8/2016 | Fujita et al. |
| 10,388,706 | B2 | 8/2019 | Lee et al. |
| 10,985,220 | B2 | 4/2021 | Lee et al. |
| 2006/0113907 | A1 | 6/2006 | Im et al. |
| 2013/0320368 | A1* | 12/2013 | Seo ................. H10K 50/13 257/89 |
| 2014/0225100 | A1 | 8/2014 | Yokoyama et al. |
| 2015/0021627 | A1 | 1/2015 | Fujita et al. |
| 2015/0102331 | A1* | 4/2015 | Seo ................. H10K 59/32 257/40 |
| 2017/0352695 | A1 | 12/2017 | Tsuchiya |
| 2018/0261655 | A1 | 9/2018 | Lee et al. |
| 2019/0115542 | A1 | 4/2019 | Yokoyama et al. |
| 2022/0069258 | A1 | 3/2022 | Watabe et al. |

FOREIGN PATENT DOCUMENTS

| | | |
|---|---|---|
| CN | 104299978 A | 1/2015 |
| CN | 108573995 A | 9/2018 |
| EP | 1670084 A | 6/2006 |
| EP | 2757860 A | 7/2014 |
| EP | 2827283 A | 1/2015 |
| EP | 3373355 A | 9/2018 |
| JP | 2006-156390 A | 6/2006 |
| JP | 2012-182127 A | 9/2012 |
| JP | 2015-038859 A | 2/2015 |
| JP | 2016-115862 A | 6/2016 |
| JP | 2018-147877 A | 9/2018 |
| KR | 2006-0059068 A | 6/2006 |
| KR | 2014-0074928 A | 6/2014 |
| KR | 2018-0103206 A | 9/2018 |
| TW | 201319021 | 5/2013 |
| TW | 201834295 | 9/2018 |
| WO | WO-2013/038627 | 3/2013 |
| WO | WO-2020/178660 | 9/2020 |

OTHER PUBLICATIONS

Written Opinion (Application No. PCT/IB2019/060207) dated Feb. 25, 2020.

* cited by examiner

LIGHT-EMITTING DEVICE, LIGHT-EMITTING APPARATUS, ELECTRONIC DEVICE, AND LIGHTING DEVICE

CROSS REFERENCE TO RELATED APPLICATIONS

This application is a U.S. National Phase Application under 35 U.S.C. § 371 of International Application PCT/IB2019/060207, filed on Nov. 27, 2019, which is incorporated by reference and claims the benefit of a foreign priority application filed in Japan on Dec. 10, 2018, as Application No. 2018-230585.

TECHNICAL FIELD

One embodiment of the present invention relates to a light-emitting device, a light-emitting apparatus, an electronic device, and a lighting device. However, one embodiment of the present invention are not limited thereto. That is, one embodiment of the present invention relates to an object, a method, a manufacturing method, or a driving method. Alternatively, one embodiment of the present invention relates to a process, a machine, manufacture, or a composition of matter.

BACKGROUND ART

A light-emitting device including an EL layer between a pair of electrodes (also referred to as a light-emitting element or an organic EL element) has characteristics such as thinness, light weight, high-speed response to input signals, and low power consumption; thus, a display including such a light-emitting device has attracted attention as a next-generation flat panel display.

In a light-emitting device, voltage application between a pair of electrodes causes, in an EL layer, recombination of electrons and holes injected from the electrodes, which brings a light-emitting substance (organic compound) contained in the EL layer into an excited state, and the light-emitting substance emits light when returning to the ground state from the excited state. The excited state can be a singlet excited state (S*) and a triplet excited state (T*), and light emission from a singlet excited state is referred to as fluorescence, and light emission from a triplet excited state is referred to as phosphorescence. The statistical generation ratio thereof in the light-emitting device is considered to be S*:T*=1:3. Since the emission spectrum obtained from a light-emitting substance depends on the light-emitting substance, the use of different types of organic compounds as light-emitting substances makes it possible to obtain light-emitting devices which exhibit various emission colors.

Although in order to improve device characteristics of such a light-emitting device, improvement of a device structure, development of a material, and the like have been carried out, increasing the extraction efficiency of light from a light-emitting device is important for higher emission efficiency of a light-emitting device. In order to increase the extraction efficiency of light from a light-emitting device, a method has been proposed, in which a micro optical resonator (microcavity) structure utilizing a resonant effect of light between a pair of electrodes is used to increase the intensity of light having a specific wavelength (e.g., see Patent Document 1).

REFERENCE

Patent Document

[Patent Document 1] Japanese Published Patent Application No. 2012-182127

SUMMARY OF THE INVENTION

Problems to be Solved by the Invention

In a light-emitting device with a microcavity structure, an electrode material having high reflectance is preferably used for a reflective electrode and a semi-transmissive and semi-reflective electrode. However, in the case where light emitted from an EL layer between both the electrodes is light in a general visible light range (around 400 nm to 750 nm), the increase in the thickness using these materials having high reflectance to enhance reflectance causes increases loss due to absorption of part of light by the semi-transmissive and semi-reflective electrode, which brings a problem of a decrease in emission efficiency. Thus, in a light-emitting device that emits light in the general visible light range, the efficiency is increased by reducing the thickness of the semi-transmissive and semi-reflective electrode.

Accordingly, in one embodiment of the present invention, a novel light-emitting device with a microcavity structure which can improve emission efficiency compared to the conventional one is provided. Moreover, a novel light-emitting device with a microcavity structure whose reliability can be improved is provided.

Note that the description of these objects does not preclude the existence of other objects. One embodiment of the present invention does not have to achieve all these objects. Other objects will be apparent from the description of the specification, the drawings, the claims, and the like, and other objects can be derived from the description of the specification, the drawings, the claims, and the like.

Means for Solving the Problems

In a light-emitting device with the microcavity structure, when the light emitted from the EL layer is light emission in a near-infrared range (around 750 nm to 1000 nm) and when an electrode of the light-emitting device contains a material having high reflectance such as gold (Au), silver (Ag), or copper (Cu), in a certain thickness range in which the semi-transmissive and semi-reflective electrode has a large thickness, it is revealed by simulation that the light-emitting device with the microcavity structure has high reflectance with respect to light in the near-infrared range as compared to reflectance with respect to light in the visible light range. Note that in this specification, the reflectance of the reflective electrode with respect to visible light (light with a wavelength greater than or equal to 400 nm and less than 750 nm) or near-infrared light (light with a wavelength greater than or equal to 750 nm and less than or equal to 1000 nm) is higher than or equal to 40% and less than or equal to 100%, preferably higher than or equal to 70% and less than or equal to 100%, and the reflectance of the semi-transmissive and semi-reflective electrode with respect to visible light or near-infrared light is higher than or equal to 20% and less than or equal to 80%, preferably higher than or equal to 40% and less than or equal to 70%.

Thus, in a light-emitting device with a microcavity structure that emits light in a near-infrared range, a material having high reflectance is used for the reflective electrode of the light-emitting device or for both the reflective electrode and the semi-transmissive and semi-reflective electrode, and the thickness of the semi-transmissive and semi-reflective electrode is set to greater than or equal to 20 nm and less than or equal to 60 nm, whereby a light-emitting device having high emission efficiency can be obtained.

Note that by increasing the thickness of the electrode more than conventional one within the above range, an electrode with high reflectance can be formed while preventing light absorption, and the electrode having a large thickness can reduce the resistance thereof, whereby a light-emitting device having high emission efficiency and reduced driving voltage can be obtained.

One embodiment of the present invention is a light-emitting device including an EL layer between a first electrode and a second electrode; the first electrode is a reflective electrode and the second electrode is a semi-transmissive and semi-reflective electrode having both functions of transmitting and reflecting light (in particular, light in a near-infrared range (greater than or equal to 750 nm and less than or equal to 1000 nm)); the EL layer emits light in a near-infrared range; and the reflectance of one or both of the first electrode and the second electrode with respect to light in a near-infrared range (e.g., light with a wavelength of 850 nm) is higher than the reflectance thereof with respect to light (e.g., light with a wavelength of 500 nm) in a visible light range (greater than or equal to 400 nm and less than 750 nm).

Another embodiment of the present invention is a light-emitting device including an EL layer between a first electrode and a second electrode; the first electrode is a reflective electrode and the second electrode is a semi-transmissive and semi-reflective electrode having both functions of transmitting and reflecting light (in particular, light in a near-infrared range (greater than or equal to 750 nm and less than or equal to 1000 nm)); the EL layer emits light in a near-infrared range; the reflectance of one or both of the first electrode and the second electrode with respect to light in a near-infrared range (e.g., light with a wavelength of 850 nm) is higher than the reflectance thereof with respect to light (e.g., light with a wavelength of 500 nm) in a visible light range (greater than or equal to 400 nm and less than 750 nm); and the second electrode has a thickness of greater than or equal to 20 nm and less than or equal to 60 nm, preferably greater than or equal to 30 nm and less than or equal to 60 nm, further preferably greater than or equal to 40 nm and less than or equal to 50 nm.

Note that in each of the above structures, it is preferable that an organic layer be included in contact with the second electrode, and the organic layer have a refractive index of greater than or equal to 1.7.

Note that in the above structure, the thickness of the organic layer is greater than or equal to 80 nm and less than or equal to 160 nm, further preferably greater than or equal to 80 nm and less than or equal to 120 nm.

Another embodiment of the present invention is a light-emitting device including an EL layer between a first electrode and a second electrode; the first electrode is a reflective electrode and the second electrode is a semi-transmissive and semi-reflective electrode; the EL layer includes a light-emitting substance having an emission peak in a near-infrared range (a wavelength range from 750 nm to 1000 nm); and light emitted from the EL layer has longer wavelength than the emission peak of the light-emitting substance.

Note that in each of the above structures, the first electrode or the second electrode preferably contains at least one of gold (Au), silver (Ag), and copper (Cu).

In each of the above structures, the reflectance of the first electrode with respect to light with a wavelength of 850 nm is preferably higher than or equal to 90%.

In each of the above structures, the reflectance of the second electrode with respect to light with a wavelength of 850 nm is preferably higher than or equal to 90%.

In each of the above structures, the light-emitting substance is preferably a phosphorescent substance.

In each of the above structures, the light-emitting substance is preferably an organometallic complex represented by General Formula (G1).

[Chemical Formula 1]

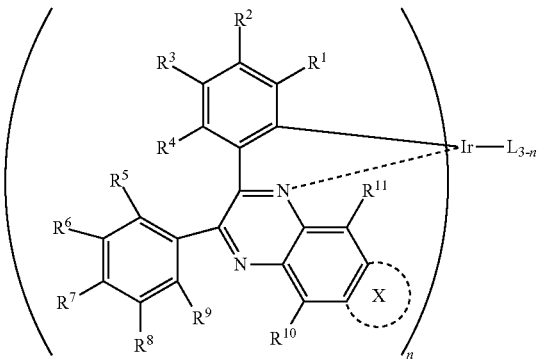

(G1)

In the above General Formula (G1), each of $R^1$ to $R^{11}$ independently represents hydrogen or an alkyl group having 1 to 6 carbon atoms; at least two of $R^1$ to $R^4$ represent an alkyl group having 1 to 6 carbon atoms; at least two of $R^5$ to $R^9$ represent an alkyl group having 1 to 6 carbon atoms; X represents a substituted or unsubstituted benzene ring or naphthalene ring; n is 2 or 3; and L represents a monoanionic ligand.

Note that one embodiment of the present invention includes, in its category, in addition to a light-emitting apparatus including the above-described light-emitting device, an electronic device including a light-emitting device or a light-emitting apparatus (specifically, an electronic device including a light-emitting device or a light-emitting apparatus and a connection terminal or an operation key) and a lighting device including a light-emitting device or a light-emitting apparatus (specifically, a lighting device including a light-emitting device or a light-emitting apparatus and a housing). Accordingly, a light-emitting apparatus in this specification refers to an image display device or a light source (including a lighting apparatus). In addition, a light-emitting apparatus includes a module in which a light-emitting apparatus is connected to a connector such as an FPC (Flexible Printed Circuit) or a TCP (Tape Carrier Package), a module in which a printed wiring board is provided on the tip of a TCP, or a module in which an IC (integrated circuit) is directly mounted on a light-emitting device by a COG (Chip On Glass) method.

Effect of the Invention

According to one embodiment of the present invention, a novel light-emitting device with a microcavity structure which can improve emission efficiency compared to the conventional one can be provided. Moreover, according to one embodiment of the present invention, a novel light-emitting device with a microcavity structure and whose reliability can be improved can be provided.

Note that the description of these effects does not preclude the existence of other objects. One embodiment of the present invention does not have to achieve all these effects. Other effects will be apparent from the description of the specification, the drawings, the claims, and the like, and other effects can be derived from the description of the specification, the drawings, the claims, and the like.

MODE FOR CARRYING OUT THE INVENTION

Figure 1A:
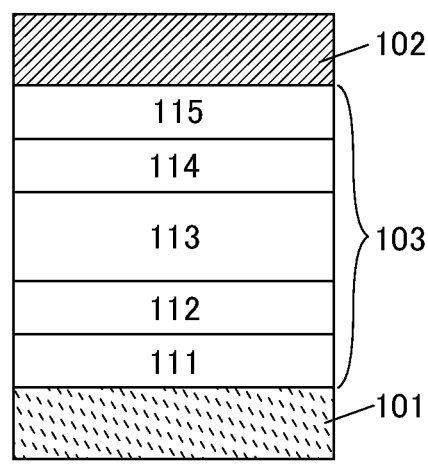
FIG. 1A and FIG. 1B illustrate structures of light-emitting device.

Embodiments of the present invention will be described in detail below with reference to drawings. Note that the present invention is not limited to the following description, and the modes and details of the present invention can be modified in various ways without departing from the spirit and scope of the present invention. Thus, the present invention should not be construed as being limited to the description in the following embodiments.

Note that the position, size, range, or the like of each component shown in drawings and the like is not accurately represented in some cases for easy understanding. Therefore, the disclosed invention is not necessarily limited to the position, size, range, or the like disclosed in drawings and the like.

Furthermore, when describing the structures of the invention with reference to the drawings in this specification and the like, the reference numerals denoting the same components are commonly used in different drawings.

Embodiment 1

In this embodiment, a light-emitting device of one embodiment of the present invention will be described with reference to FIG. 1 and FIG. 2. Note that common reference numerals are used in FIG. 1 and FIG. 2.

<<Structure of Light-Emitting Device>>

FIG. 1 illustrates examples of a light-emitting device including, between a pair of electrodes, an EL layer having a light-emitting layer. Specifically, the light-emitting device has a structure in which an EL layer 103 is sandwiched between a first electrode 101 and a second electrode 102. Note that the EL layer 103 has a structure in which, for example, a hole-injection layer 111, a hole-transport layer 112, a light-emitting layer 113, an electron-transport layer 114, and an electron-injection layer 115 are sequentially stacked as functional layers, in the case where the first electrode 101 serves as an anode.

Note that the light-emitting device of one embodiment of the present invention has a micro optical resonator (microcavity) structure in which one of the pair of electrodes serves as a reflective electrode and the other serves as a semi-transmissive and semi-reflective electrode, which enables repetition of reflection and amplification of light with a wavelength corresponding to a distance between the electrodes (also referred to as cavity length or optical path length). The cavity length can be changed by adjusting the thickness of the EL layer or the electrode. In the case where the cavity length is adjusted with the electrode, a transparent electrode such as ITO can be used. In the case where the EL layer 103 is adjusted, the thickness of a carrier-transport layer or a carrier-injection layer is adjusted, so that the optical path length can be controlled.

As for the light emission direction of the light-emitting device, either a top-emission structure or a bottom-emission structure may be employed. For example, a light-emitting device having a top-emission structure as illustrated in FIG. 2 has a semi-transmissive and semi-reflective property in which the first electrode 101 has a reflective property and the second electrode 102 has both a transmitting property and a reflective property with respect to light. Specifically, the first electrode 101 is a reflective electrode, and the reflectance of the electrode with respect to visible light or near-infrared light is higher than or equal to 40% and lower than or equal to 100%, preferably higher than or equal to 70% and lower than or equal to 100%. In addition, the second electrode 102 is a semi-transmissive and semi-reflective electrode, and the reflectance of the electrode with respect to visible light or near-infrared light is higher than or equal to 20% and lower than or equal to 80%, preferably higher than or equal to 40% and lower than or equal to 70%. The resistivity of each of these electrodes is preferably $1 \times 10^{-2}$ Ωcm or lower. Accordingly, by adjusting the optical path length from the interface (reflective region) between the first electrode 101 and the EL layer 103 to the light-emitting layer 113 (light-emitting region) and the optical path length from the interface (reflective region) between the second electrode 102 and the EL layer 103 to the light-emitting layer 113 (light-emitting region), the intensity of desired light (wavelength) emitted from the light-emitting layer 113 can be increased. Note that in order to increase the extraction efficiency of light more effectively, an organic compound layer (an organic cap layer 105) with a molecular weight greater than or equal to 300 and less than or equal to 1200 is preferably formed over a surface of the second electrode 102 (semi-transmissive and semi-reflective electrode) which is opposite to a surface facing the reflective electrode.

When the organic cap layer 105 is provided in contact with the second electrode 102 in the light-emitting device, the difference in refractive index at the interface between the second electrode 102 and the air can be reduced, resulting in improvement in light extraction efficiency. An organic compound layer with a molecular weight greater than or equal to 300 and less than or equal to 1200 is preferably used as the organic cap layer 105. Furthermore, the organic cap layer is preferably formed using a conductive organic material. In the case where the second electrode 102 is the semi-transmissive and semi-reflective electrode, the thickness needs to be small so as to ensure a certain light-transmitting property; thus, the conductivity might be decreased. Thus, with the use of a conductive material for the organic cap layer 105, while the light extraction efficiency is improved, the conductivity can be ensured and the manufacturing yield of the light-emitting element can be improved. Note that an organic compound that is less likely to absorb desired light in a wavelength range can be favorably used. For the organic cap layer 105, the organic compound used for the EL layer 103 can also be used. In that case, the organic cap layer 105 can be formed with a deposition apparatus or a deposition chamber for forming the EL layer 103, so that the organic cap layer 105 can be easily formed.

Note that the optical path length from the interface (reflective region) between the first electrode 101 and the EL layer 103 to the light-emitting layer 113 (light-emitting region) is represented by the product of the length from the interface (reflective region) between the first electrode 101 and the EL layer 103 to the light-emitting layer 113 (light-emitting region) and the refractive index. Moreover, the optical path length from the interface (reflective region) between the second electrode 102 and the EL layer 103 to the light-emitting layer 113 (light-emitting region) is represented by the product of the length from the interface (reflective region) between the second electrode 102 and the EL layer 103 to the light-emitting layer 113 (light-emitting region) and the refractive index.

Thus, for example, when the refractive index of the first electrode (reflective electrode) 101 is lower than the refractive index of the EL layer 103, the optical path length from the first electrode 101 to the second electrode 102 is adjusted in neighborhood of $m\lambda/2$ (m represents a natural number and $\lambda$ represents a wavelength of desired light) by adjusting the thickness of the first electrode 101, so that the intensity of the desired light (wavelength) emitted from the light-emitting layer 113 can be increased. Note that by adjusting the thickness of any one or more layers of the hole-injection layer 111, the hole-transport layer 112, the electron-transport layer 114, and the electron-injection layer 115 layer, the intensity of the desired light (wavelength) in the light exhibited by the light-emitting layer 113 can be increased.

Figure 2:
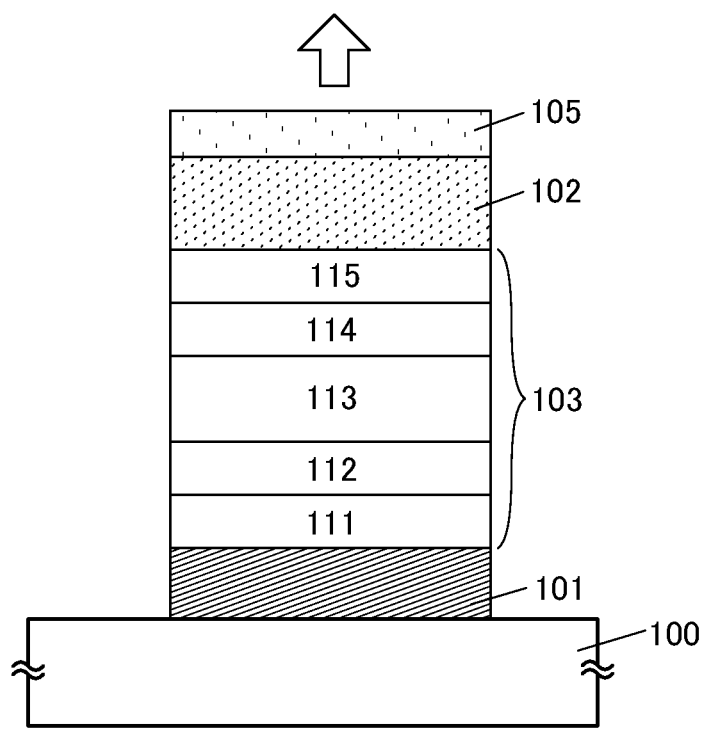
FIG. 2 illustrates a structure of a light-emitting device.

Note that other than the structure in FIG. 2, a bottom-emission light-emitting device in which the first electrode 101 is a semi-transmissive and semi-reflective electrode and the second electrode 102 is a reflective electrode may be employed.

<First Electrode and Second Electrode>

The light-emitting device of one embodiment of the present invention has a structure in which any one of the first electrode 101 and the second electrode 102 is a semi-transmissive and semi-reflective electrode and the other is a reflective electrode as described above, which is preferable in order to obtain high emission efficiency.

Any of the following materials can be used in an appropriate combination as long as the functions of the electrodes described above can be fulfilled. For example, a metal, an alloy, an electrically conductive compound, a mixture of these, and the like can be used as appropriate. Specifically, an In—Sn oxide (also referred to as ITO), an In—Si—Sn oxide (also referred to as ITSO), an In—Zn oxide, or an In—W—Zn oxide can be given. In addition, it is also possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 of the periodic table, which is not listed above as an example (for example, lithium (Li), cesium (Cs), calcium (Ca), or strontium (Sr)), a rare earth metal such as europium (Eu) or ytterbium (Yb), an alloy containing an appropriate combination of any of these elements, graphene, or the like.

Figure 3:
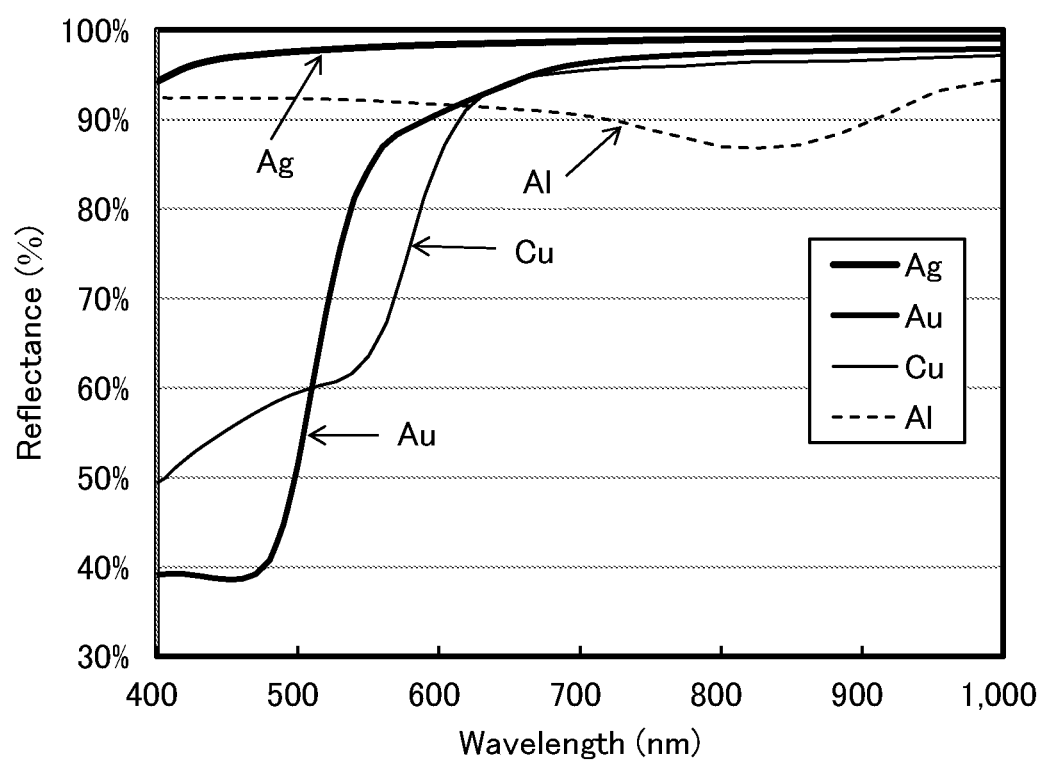
FIG. 3 shows simulation results of reflectance of electrode materials.

Among the materials listed above, how reflectance of gold (Au), silver (Ag), copper (Cu), and aluminum (Al), which are materials having high reflectance, moves with respect to the wavelength of light is simulated. FIG. 3 shows the results.

The results in FIG. 3 show that although silver (Ag) has high reflectance with respect to lights having different wavelengths with little influence, silver (Ag) has higher reflectance with respect to light in a near-infrared range of 750 nm or more (around 750 nm to 1000 nm) compared with light in a visible light range of less than 750 nm (around 400 nm to 750 nm). In addition, gold (Au) and copper (Cu) each have low reflectance with respect to light in the visible light range of lower than 750 nm (around 400 nm to 750 nm) and have high reflectance with respect to light in the near-infrared range of 750 nm or more (around 750 nm to 1000 nm). Moreover, the result can be obtained that aluminum (Al), which is frequency used as a material for a reflective electrode of a light-emitting device, has high reflectance with respect to light in the visible light range; however, aluminum (Al) has low reflectance with respect to light having a long wavelength of 750 nm or more, that is, light in the near-infrared range.

Accordingly, it is found that in the case where a wavelength of light emitted from the light-emitting layer 113 in a light-emitting device is light with a long wavelength of 750 nm or more, it is preferable to use gold (Au), silver (Ag), or copper (Cu) as an electrode material of a reflective electrode or a semi-transmissive and semi-reflective electrode. These electrode materials are preferable because of having higher reflectance with respect to light with a wavelength of 850 nm than that with respect to light with a wavelength of 500 nm. In addition, these electrode materials are preferable because of having reflectance of 90% or more at a wavelength of 850 nm.

Figure 4:
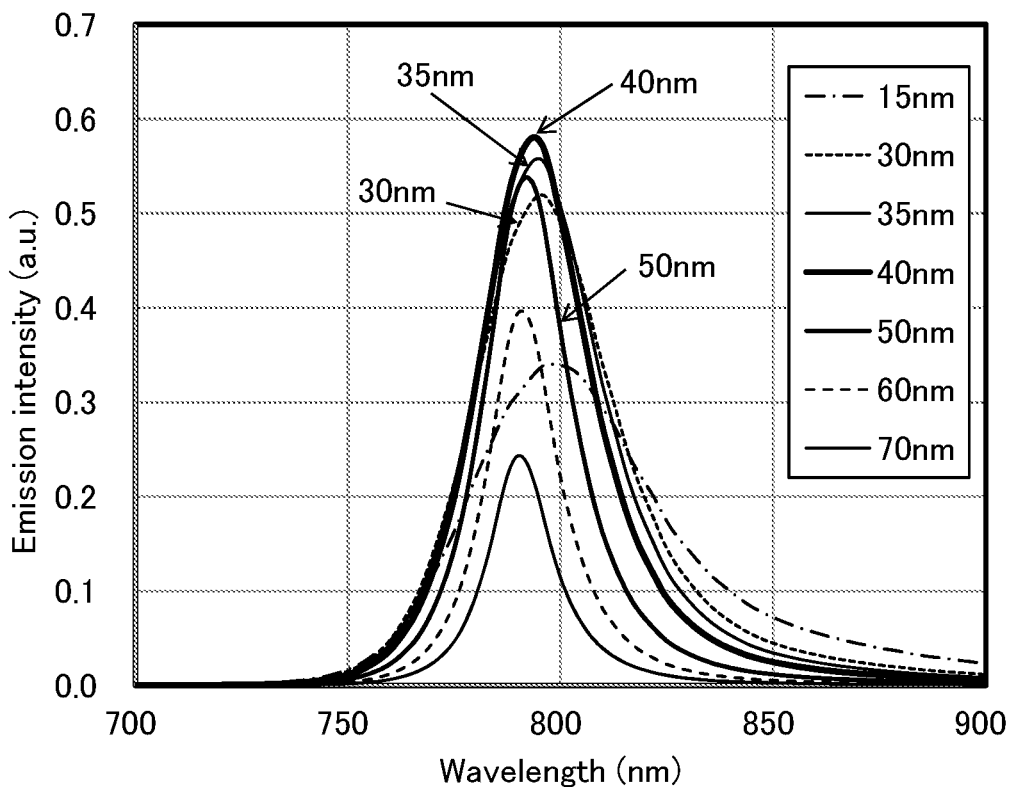
FIG. 4 shows simulation results of EL emission spectra emitted in a front direction.

Here, simulation was performed on changes of EL emission spectra emitted in a front direction due to changing in thickness of the second electrode 102, which serves as a semi-transmissive and semi-reflective electrode, using a light-emitting device 0 having a top-emission structure illustrated in FIG. 2 as a model. FIG. 4 shows the results. Table 1 shows an element structure of the light-emitting device 0. Note that the light obtained from the light-emitting layer 113 is derived from light emission of [Ir(dmdpbq)$_2$(dpm)] because the light-emitting layer 113 of the light-emitting device 0 includes an organometallic complex [Ir(dmdpbq)$_2$(dpm)] as a light-emitting substance, and the thicknesses of the hole-injection layer 111, the electron-injection layer 115, and the organic cap layer 105 are adjusted as appropriate because optical adjustment is required with the change in thickness of the second electrode 102 such that an emission intensity at a wavelength around 800 nm becomes maximum.

TABLE 1

| | First electrode 101 | Hole-injection layer 111 | Hole-transport layer 112 | Light-emitting layer 113 | Electron-transport layer 114 | Electron-injection layer 115 | Second electrode 102 | Organic cap layer 105 |
|---|---|---|---|---|---|---|---|---|
| Light-emitting device 0 | APC (200 nm) | ITSO (10 nm) | DBT3P-II: MoOx (2:1) | PCBBiF (20 nm) | * | 2mDBTBPDBq-II (20 nm) | NBphen | Ag:Mg (10:1) | DBT3P-II |

* 2mDBTBPDBq-II:PCBBiF:[Ir(dmdpbq)$_2$(dpm)] (0.8:0.2:0.1 50 nm)

Figure 5:
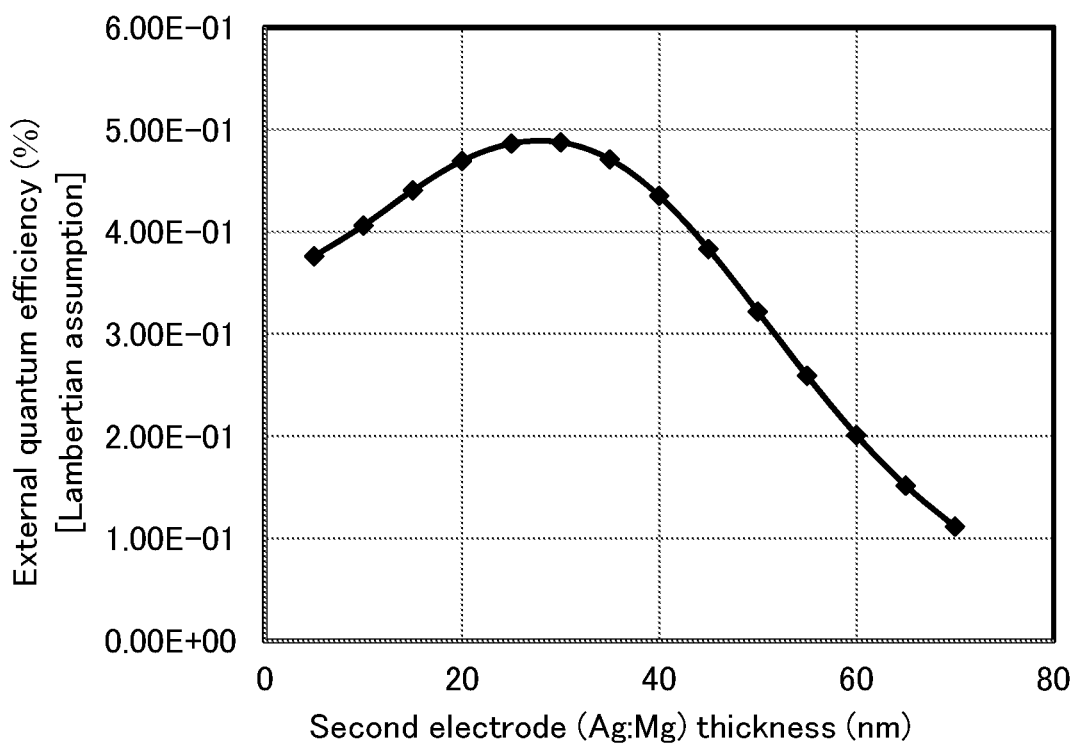
FIG. 5 shows simulation results of light extraction efficiency of an EL emission spectrum emitted in a front direction.
Figure 6:
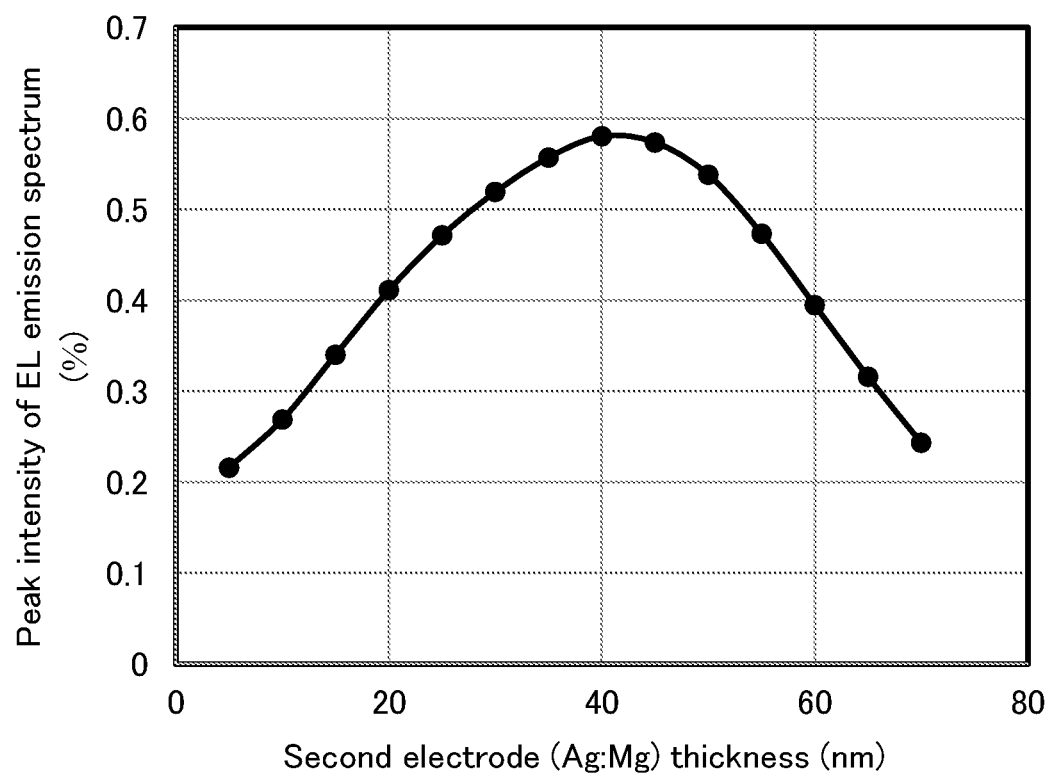
FIG. 6 shows simulation results of a peak intensity of an EL emission spectrum emitted in a front direction.

According to the results shown in FIG. 4, when optical adjustment is performed depending on the thickness of the second electrode 102 in the light-emitting device 0, an emission peak intensity of the EL emission spectra at a wavelength around 800 nm has a maximum value with the thickness of the second electrode 102 of 40 nm, and narrowed EL emission spectra can be obtained with the thickness of the second electrode 102 of greater than or equal to 30 nm and less than or equal to 60 nm. FIG. 5 shows a relation between the area of the EL emission spectra in a front direction in the wavelength range of the simulation shown in FIG. 4 and the thickness of the second electrode 102. As a result, the total amount of light in a front direction show a local maximum value with the thickness of the second electrode 102 of greater than or equal to 20 nm and less than or equal to 40 nm. FIG. 6 shows a relation between the peak intensity of the EL emission spectra in a front direction in the wavelength range of the simulation shown in FIG. 4 and the thickness of the second electrode 102. As a result, the peak intensity of the EL emission spectra in a front direction show a local maximum value with the thickness of the second electrode 102 of greater than or equal to 20 nm and less than or equal to 60 nm. Thus, the thickness of the second electrode 102 is preferably greater than or equal to 20 nm and less than or equal to 60 nm, further preferably greater than or equal to 30 nm and less than or equal to 60 nm, still further preferably greater than or equal to 30 nm and less than or equal to 50 nm.

The simulation results show that in the case where the wavelength of the emitted light is 750 nm or more, the thickness of the organic cap layer 105 is preferably greater than or equal to 80 nm and less than or equal to 160 nm, further preferably greater than or equal to 80 nm and less than or equal to 120 nm.

For fabrication of these electrodes, a sputtering method or a vacuum evaporation method can be used.

<Hole-Injection Layer>

The hole-injection layer 111 is a layer injecting holes from the first electrode 101 that is an anode to the EL layer 103, and is a layer containing an organic acceptor material or a material with a high hole-injection property.

The organic acceptor material is a material that allows holes to be generated in another organic compound whose HOMO level value is close to the LUMO level value of the organic acceptor material when charge separation is caused between the organic acceptor material and the organic compound. Thus, as the organic acceptor material, a compound having an electron-withdrawing group (a halogen group or a cyano group), such as a quinodimethane derivative, a chloranil derivative, or a hexaazatriphenylene derivative, can be used. For example, 7,7,8,8-tetracyano-2,3,5,6-tetrafluoroquinodimethane (abbreviation: F4-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), or 1,3,4,5,7,8-hexafluorotetra-cyano-naphthoquinodimethane (abbreviation: F6-TCNNQ) can be used. Among organic acceptor materials, HAT-CN, which has a high acceptor property and stable film quality against heat, is particularly favorable. Besides, a [3]radialene derivative has a very high electron-accepting property and thus is preferable; specifically, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], α,α',α"-1,2,3-cyclopropanetriylidenetris[2,3,4,5,6-pentafluorobenzeneacetonitrile], or the like can be used.

Examples of the material with a high hole-injection property include transition metal oxides such as molybdenum oxide, vanadium oxide, ruthenium oxide, tungsten oxide, and manganese oxide. Alternatively, it is possible to use a phthalocyanine-based compound such as phthalocyanine (abbreviation: H$_2$Pc) or copper phthalocyanine (abbreviation: CuPC), or the like.

In addition to the above materials, it is also possible to use an aromatic amine compound, which is a low molecular compound, such as 4,4',4"-tris(N,N'-diphenylamino)triphenylamine (abbreviation: TDATA), 4,4',4"-tris[N-(3-methylphenyl)-N-phenyl amino]triphenylamine (abbreviation: MTDATA), 4,4'-bis[N-(4-di phenyl aminophenyl)-N-phenylamino]biphenyl (abbreviation: DPAB), 4,4'-bis(N-{4-[N-(3-methyl phenyl)-N-phenyl amino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1).

It is also possible to use a high molecular compound (an oligomer, a dendrimer, a polymer, or the like) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis(4-butylphenyl)-N,N'-bis(phenyl)benzidine]

(abbreviation: Poly-TPD). Alternatively, it is also possible to use a high molecular compound to which acid is added, such as poly(3,4-ethylenedioxythiophene)/poly(styrenesulfonic acid) (abbreviation: PEDOT/PSS) or polyaniline/poly(styrenesulfonic acid) (PAni/PSS).

Alternatively, as the material having a high hole-injection property, a composite material containing a hole-transport material and an acceptor material (electron-accepting material) can be used. In this case, the acceptor material extracts electrons from the hole-transport material, so that holes are generated in the hole-injection layer 111 and the holes are injected into the light-emitting layer 113 through the hole-transport layer 112. Note that the hole-injection layer 111 may be formed to have a single-layer structure of a composite material containing a hole-transport material and an acceptor material (electron-accepting material), or a stacked-layer structure in which a layer containing a hole-transport material and a layer containing an acceptor material (electron-accepting material) are stacked.

As the hole-transport material, a substance having a hole mobility of greater than or equal to $1\times10^{-6}$ cm$^2$/Vs is preferable. Note that other substances can be used as long as they have a property of transporting more holes than electrons.

As the hole-transport material, a material having a high hole-transport property, such as a π-electron rich heteroaromatic compound, is preferable. As the π-electron rich heteroaromatic compound, an aromatic amine compound having an aromatic amine skeleton (having a triarylamine skeleton), a carbazole compound having a carbazole skeleton (not having a triarylamine skeleton), a thiophene compound (a compound having a thiophene skeleton), a furan compound (a compound having a furan skeleton), or the like can be given.

Examples of the above aromatic amine compound include 4,4'-bis[N-(1-naphthyl)-N-phenyl amino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2[N-(4-diphenylaminophenyl)-N-phenyl amino]spiro-9,9'-bifluorene (abbreviation: DPASF), 2,7-bis[N-(4-diphenylaminophenyl)-N-phenylamino]-spiro-9,9'-bifluorene (abbreviation: DPA2SF), 4,4',4"-tris[N-(1-naphthyl)-N-phenylamino]triphenylamine (abbreviation: 1'-TNATA), 4,4',4"-tris(N,N'-diphenylamino)triphenylamine (abbreviation: TDATA), 4,4',4"-tris[N-(3-methylphenyl)-N-phenylamino]triphenylamine (abbreviation: m-MTDATA), N,N'-di(p-tolyl)-N,N'-diphenyl-p-phenylenediamine (abbreviation: DTDPPA), 4,4'-bis[N-(4-diphenylaminophenyl)-N-phenyl amino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-aminophenyl)-N-phenyl amino]benzene (abbreviation: DPA3B).

Examples of the aromatic amine compound having a carbazolyl group include 4-phenyl-4'-(9-phenyl-9H-carbazol-3-yl)triphenyl amine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenyl amine (abbreviation: PCBBi1BP), 4-(1-naphthyl)-4'-(9-phenyl-9H-carbazol-3-yl)triphenyl amine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenyl-benzene-1,3-diamine (abbreviation: PCA2B), N,N',N"-triphenyl-N,N',N"-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-[4-(9-phenyl-9H-carbazol-3-yl)phenyl]-bis(9,9-dimethyl-9H-fluoren-2-yl)amine (abbreviation: PCBFF), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N-[4-(9-phenyl-9H-carbazol-3-yl)phenyl]-9,9-dimethyl-N-[4-(1-naphthyl)phenyl]-9H-fluoren-2-amine (abbreviation: PCBNBF), N-phenyl-N-[4-(9-phenyl-9H-carbazol-3-yl)phenyl]spiro-9,9'-bifluoren-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-amino]-9-phenyl carbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenyl aminophenyl)-N-phenyl amino]-9-phenyl carbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenyl aminophenyl)-N-(1-naphthyl)amino]-9-phenyl carbazole (abbreviation: PCzTPN2), 2-[N-(9-phenyl carbazol-3-yl)-N-phenyl amino]spiro-9,9'-bifluorene (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N'-diphenyl-9,9-dimethylfluorene-2,7-di amine (abbreviation: YGA2F), and 4,4',4"-tris(carbazol-9-yl)triphenylamine (abbreviation: TCTA).

Examples of the carbazole compound (not having a triarylamine skeleton) include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). Furthermore, examples of the carbazole compound (not having a triarylamine skeleton) include 3,3'-bis(9-phenyl-9H-carbazole) (abbreviation: PCCP), 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP), which are bicarbazole derivatives (e.g., a 3,3'-bicarbazole derivative).

Examples of the thiophene compound (the compound having a thiophene skeleton) include 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV).

Examples of the furan compound (the compound having a furan skeleton) include 4,4',4"-(benzene-1,3,5-triyl)tri (dibenzofuran) (abbreviation: DBF3P-II), and 4-{3-[3-(9-phenyl-9H-fluoren-9-yl)phenyl]phenyl}dibenzofuran (abbreviation: mmDBFFLBi-II).

In addition, a high molecular compound such as poly(N-vinylcarbazole) (abbreviation: PVK), poly (4-vinyltriphenylamine) (abbreviation: PVTPA), poly[N-(4-{-N'-[4-(4-diphenylamino)phenyl]phenyl-N'-phenylamino}phenyl) methacrylamide] (abbreviation: PTPDMA), or poly[N,N'-bis(4-butylphenyl)-N,N'-bis(phenyl)benzidine] (abbreviation: Poly-TPD) can also be used as the hole-transport material.

Note that the hole-transport material is not limited to the above, and one of or a combination of various known materials may be used as the hole-transport material.

As the acceptor material used for the hole-injection layer 111, an oxide of a metal belonging to any of Group 4 to Group 8 of the periodic table can be used. As specific examples, molybdenum oxide, vanadium oxide, niobium oxide, tantalum oxide, chromium oxide, tungsten oxide, manganese oxide, and rhenium oxide can be given. Among these, molybdenum oxide is particularly preferable since it is stable in the air, has a low hygroscopic property, and is easy to handle. It is also possible to use any of the above-described organic acceptor materials.

Note that the hole-injection layer 111 can be formed by any of various known deposition methods, and can be formed by a vacuum evaporation method, for example.

<Hole-Transport Layer>

The hole-transport layer 112 is a layer transporting holes, which are injected from the first electrode 101 through the hole-injection layer 111, to the light-emitting layer 113. Note that the hole-transport layer 112 is a layer containing a hole-transport material. Thus, for the hole-transport layer 112, a hole-transport material that can be used for the hole-injection layer 111 can be used.

Note that in the light-emitting device of one embodiment of the present invention, the same organic compound as that for the hole-transport layer 112 is preferably used for the light-emitting layer 113. This is because the use of the same organic compounds for the hole-transport layer 112 and the light-emitting layer 113 allows efficient hole transport from the hole-transport layer 112 to the light-emitting layer 113.

<Light-Emitting Layer>

The light-emitting layer 113 is a layer containing a light-emitting substance (an organic compound). There is no particular limitation on the light-emitting substance that can be used for the light-emitting layer 113, and it is possible to use a light-emitting substance that converts singlet excitation energy into light in the visible light range (e.g., a fluorescent substance) or a light-emitting substance that converts triplet excitation energy into light in the visible light range (e.g., a phosphorescent substance or a TADF material). However, in the case where the light-emitting device of one embodiment of the present invention emits light having an emission peak in a wavelength range of greater than or equal to 750 nm and less than or equal to 1000 nm from the EL layer, it is preferable to use an organic compound (e.g., an organometallic complex) having an emission peak in the wavelength range of greater than or equal to 750 nm and less than or equal to 1000 nm for the light-emitting layer. Alternatively, for example, a phthalocyanine compound (central metal: e.g., aluminum or zinc), a naphthalocyanine compound, a dithiolene compound (central metal: nickel), a quinone-based compound, a diimonium-based compound, or an azo-based compound can be used.

Note that as the organometallic complex having an emission peak in the wavelength range of greater than or equal to 750 nm and less than or equal to 1000 nm, an organometallic complex represented by General Formula below can be given, for example.

[Chemical Formula 2]

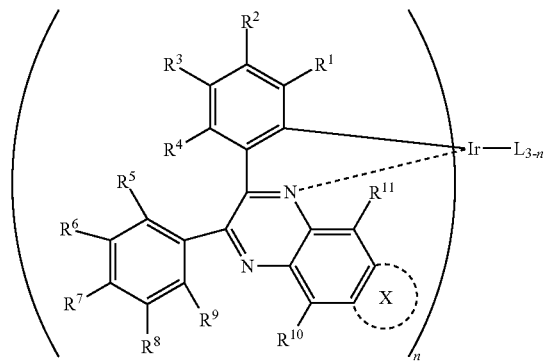

(G1)

In General Formula (G1), each of $R^1$ to $R^{11}$ independently represents hydrogen or an alkyl group having 1 to 6 carbon atoms; at least two of $R^1$ to $R^4$ represent an alkyl group having 1 to 6 carbon atoms; at least two of $R^5$ to $R^9$ represent an alkyl group having 1 to 6 carbon atoms; X represents a substituted or unsubstituted benzene ring or naphthalene ring; n is 2 or 3; and L represents a monoanionic ligand.

Examples of the alkyl group having 1 to 6 carbon atoms in General Formula (G1) include a methyl group, an ethyl group, a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a 3-methylpentyl group, a 2-methylpentyl group, a 2-ethylbutyl group, a 1,2-dimethylbutyl group, and a 2,3-dimethylbutyl group.

When the benzene ring or the naphthalene ring has a substituent in General Formula (G1), the substituent can be an alkyl group having 1 to 6 carbon atoms. The above description can be referred to for the alkyl group having 1 to 6 carbon atoms.

Examples of the monoanionic ligand include a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, and a bidentate ligand that forms a metal-carbon bond with iridium by cyclometalation.

The monoanionic ligand is preferably any one of General Formulae (L1) to (L8).

[Chemical Formula 3]

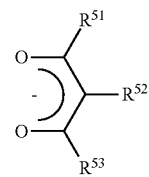

(L1)

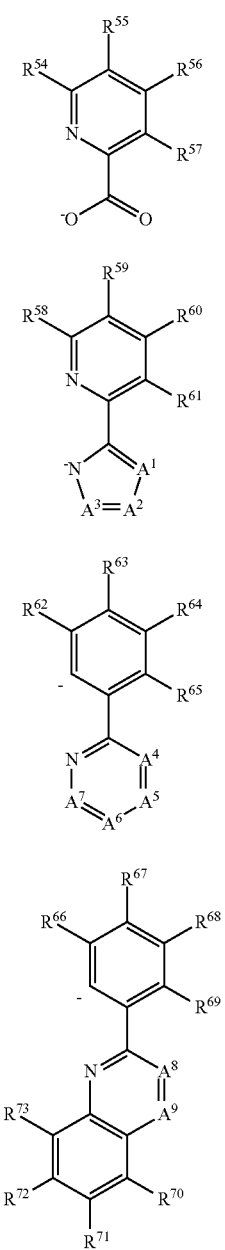

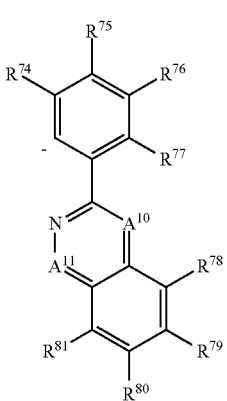

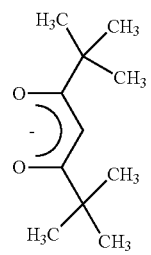

In General Formulae (L1) to (L8), each of $R^{51}$ to $R^{89}$ independently represents hydrogen, a substituted or unsubstituted alkyl group having 1 to 6 carbon atoms, a halogeno group, a vinyl group, a substituted or unsubstituted haloalkyl group having 1 to 6 carbon atoms, a substituted or unsubstituted alkoxy group having 1 to 6 carbon atoms, a substituted or unsubstituted alkylthio group having 1 to 6 carbon atoms, or a substituted or unsubstituted aryl group having 6 to 13 carbon atoms; each of $A^1$ to $A^{13}$ independently represents nitrogen, sp$^2$ hybridized carbon bonded to hydrogen, or sp$^2$ hybridized carbon having a substituent; and the substituent represents any of an alkyl group having 1 to 6 carbon atoms, a halogeno group, a haloalkyl group having 1 to 6 carbon atoms, and a phenyl group.

Note that specific examples of the organometallic complex represented by General Formula (G1) above include organometallic complexes represented by Structural Formula (100) to Structural Formula (107). Note that the present invention is not limited thereto.

[Chemical Formula 4]

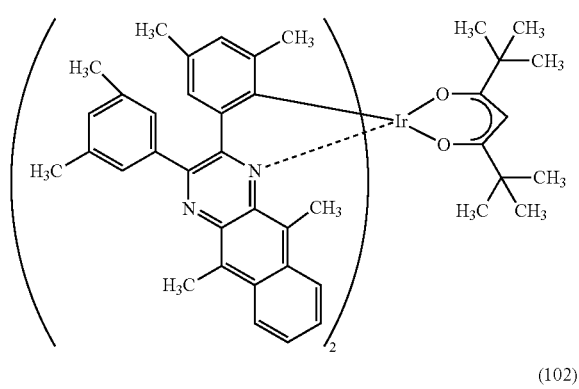

(101)

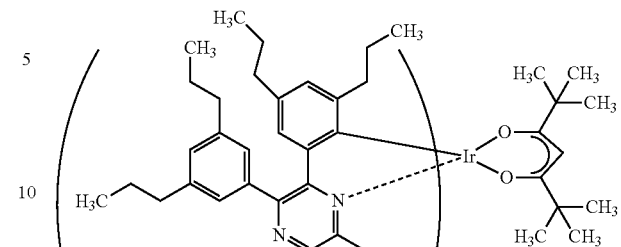

(105)

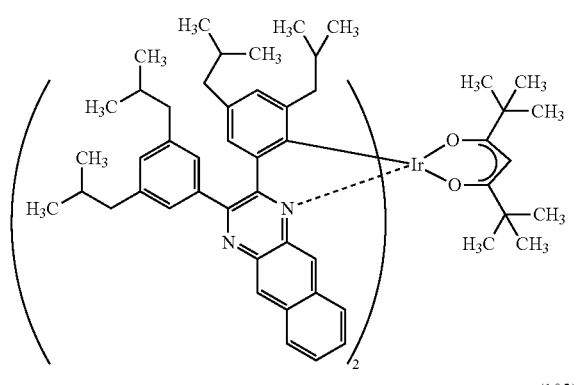

(102)

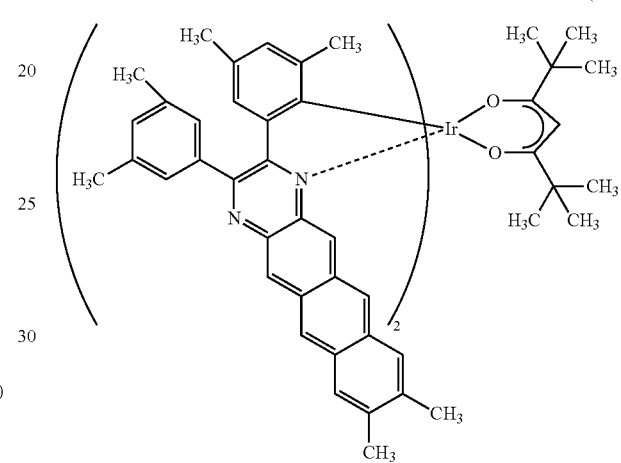

(106)

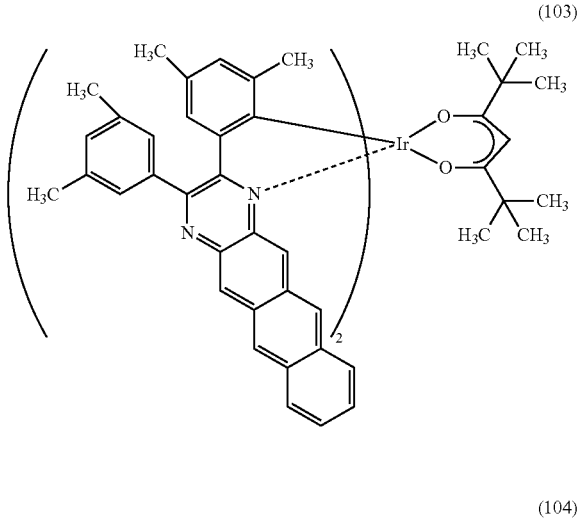

(103)

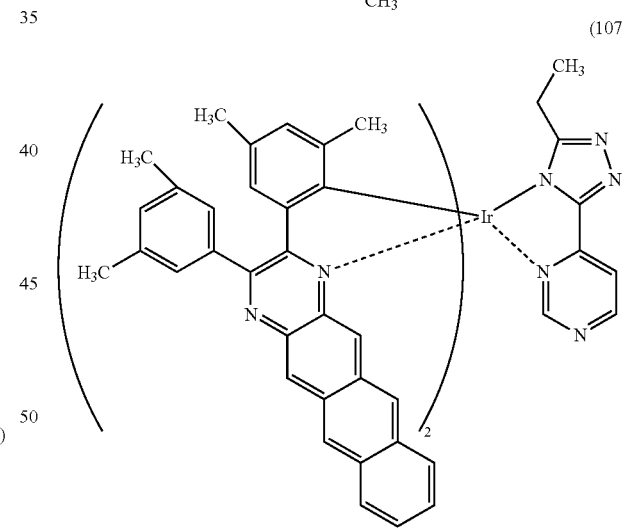

(107)

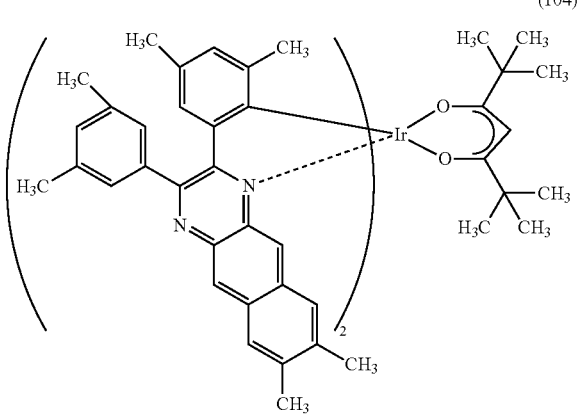

(104)

Note that as the light-emitting layer 113, a substance that exhibits emission color of blue, purple, bluish purple, green, yellowish green, yellow, orange, red, or the like other than the above can be appropriately used.

The light-emitting layer 113 includes a light-emitting substance (a guest material) and one or more kinds of organic compounds (e.g., a host material). Note that as the organic compound (e.g., a host material) used here, it is preferable to use a substance whose energy gap is larger than the energy gap of the light-emitting substance (the guest material). Examples of one or more kinds of the organic compounds (e.g., a host material) include organic compounds such as a hole-transport material that can be used for the hole-transport layer 112 described above and an electron-transport material that can be used for the electron-transport layer 114 described later.

In the case where the light-emitting layer 113 includes the first organic compound, the second organic compound, and the light-emitting substance, it is possible to use an electron-transport material as the first organic compound, a hole-transport material as the second organic compound, and a phosphorescent substance, a fluorescent substance, a TADF material, or the like as the light-emitting substance. Furthermore, in such a case, a combination of the first organic compound and the second organic compound preferably forms an exciplex.

The light-emitting layer 113 may have a structure including a plurality of light-emitting layers containing different light-emitting substances to exhibit different emission colors (for example, white light emission obtained by a combination of complementary emission colors). Alternatively, a structure may be employed in which one light-emitting layer contains a plurality of different light-emitting substances.

Examples of the light-emitting substance that can be used for the light-emitting layer 113 are given below.

As an example of the light-emitting substance that converts singlet excitation energy into light, a substance that emits fluorescence (a fluorescent substance) can be given.

Example of the fluorescent substance that is the light-emitting substance that converts singlet excitation energy into light include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl] pyrene-1,6-diamine (abbreviation: 1, 6mMemFLPAPrn), (N,N'-diphenyl-N,N'-bis[4-(9-phenyl-9H-fluoren-9-yl)phenyl]pyrene-1,6-diamine) (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[N-phenylbenzo[b] naphtho[1,2-d]furan)-6-amine] (abbreviation: 1,6BnfAPm), N,N'-(pyrene-1,6-diyl)bis[(N-phenylbenzo[b]naphtho[1,2-d]furan)-8-amine] (abbreviation: 1,6BnfAPrn-02), and N,N'-(pyrene-1,6-diyl)bis[(6,N-diphenyl benzo[b]naphtho [1,2-d]furan)-8-amine] (abbreviation: 1,6BnfAPrn-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenyl amine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8, 11-tetra(tert-butyl)perylene (abbreviation: TBP), N,N'-(2-ter t-butyl anthracene-9,10-diyldi-4,1-phenylene)bis[N,N',N'''-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N''-triphenyl-1,4-phenylenediamine (abbreviation: 2DPAPPA), or the like.

Note that as the light-emitting substance that converts singlet excitation energy into light (the fluorescent substance), which can be used for the light-emitting layer 113, a fluorescent substance that exhibits emission color (an emission peak) in part of the near-infrared light range (e.g., a material that emits red light and has a peak at greater than or equal to 800 nm and less than or equal to 950 nm) can also be used without limitation to the above-described fluorescent substance that exhibits emission color (an emission peak) in the visible light range.

Next, as an example of the light-emitting substance that converts triplet excitation energy into light, a substance that emits phosphorescence (a phosphorescent substance) and a thermally activated delayed fluorescence (TADF) material that exhibits thermally activated delayed fluorescence can be given.

First, examples of the phosphorescent substance that is the light-emitting substance that converts triplet excitation energy into light include an organometallic complex, a metal complex (a platinum complex), and a rare earth metal complex. These substances exhibit different emission colors (emission peaks), and thus are used through appropriate selection as needed. Note that, of the phosphorescent substances, the following materials can be given as the material that exhibits emission color (an emission peak) in the visible light range.

The following substances can be given as examples of a phosphorescent substance which emits blue or green light and whose emission spectrum has a peak wavelength at greater than or equal to 450 nm and less than or equal to 570 nm (for example, preferably at greater than or equal to 450 nm and less than or equal to 495 nm in the case of blue light and at greater than or equal to 495 nm and less than or equal to 570 nm in the case of green light).

For example, organometallic complexes having a 4H-triazole skeleton, such as tris {2-[5-(2-methylphenyl)-4-(2,6-dimethylphenyl)-4H-1,2,4-triazol-3-yl-$\kappa N^2$] phenyl-$\kappa$C}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir (iPrptz-3b)$_3$]), and tris[3-(5-biphenyl)-5-isopropyl-4-phenyl-4H-1,2,4-triazolato]iridium(III) (abbreviation: [Ir (iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir (Mptz1-mp)$_3$]) and tris(1-methyl-5-phenyl-3-propyl-1H-1, 2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris [3-(2,6-dimethylphenyl)-7-methylimidazo[1,2-f] phenanthridinato]iridium(III) (abbreviation: [Ir(dmpimpt-Me)$_3$]); organometallic complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6-difluorophenyl)pyridinato-N,$C^{2'}$] iridium(III) picolinate (abbreviation: FIrpic), bis{2-[3',5'-bis (trifluoromethyl)phenyl]pyridinato-N,$C^{2'}$}iridium(III) picolinate (abbreviation: [Ir(CF$_3$ppy)$_2$(pic)]), and bis[2-(4', 6'-difluorophenyl)pyridinato-N,$C^{2'}$]iridium(III) acetylacetonate (abbreviation: FIr(acac)); and the like can be given.

The following substances can be given as examples of a phosphorescent substance which emits green, yellow green, or yellow light and whose emission spectrum has a peak wavelength at greater than or equal to 495 nm and less than or equal to 590 nm. (For example, a peak wavelength at greater than or equal to 495 nm and less than or equal to 570 nm is preferable in the case of green light, a peak wavelength at greater than or equal to 530 nm and less than or equal to 570 nm is preferable in the case of yellow green light, and a peak wavelength at greater than or equal to 570 nm and less than or equal to 590 nm is preferable in the case of yellow light.)

The examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetyl acetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetyl acetonato)bis[5-methyl-6-(2-methylphenyl)-4-phenylpyrimidinato]iridium(III) (abbreviation: [Ir(mpmppm)$_2$(acac)]), (acetyl acetonato) bis{4,6-dimethyl-2-[6-(2,6-dimethylphenyl)-4-pyrimidinyl-κN$^3$]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetyl acetonate (abbreviation: [Ir(ppy)$_2$(acac)]), bis(benzo[h]quinolinato)iridium(III) acetyl acetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), bis(2-phenylquinolinato-N,C$^{2'}$)iridium(III) acetyl acetonate (abbreviation: [Ir(pq)$_2$(acac)]), bis[2-(2-pyridinyl-κN)phenyl-κC] [2-(4-phenyl-2-pyridinyl-κN)phenyl-κC] iridium(III) (abbreviation: [Ir(ppy)$_2$(4dppy)]), bis[2-(2-pyridinyl-κN)phenyl-κC] [2-(4-methyl-5-phenyl-2-pyridinyl-κN)phenyl-κC], and [2-(4-methyl-5-phenyl-2-pyridinyl-κN)phenyl-κC]bis[2-(2-pyridinyl-κN)phenyl-κC] iridium (abbreviation: [Ir(ppy)$_2$(mdppy)]); organometallic complexes such as bis(2,4-diphenyl-1,3-oxazolato-N,C$^{2'}$)iridium(III) acetyl acetonate (abbreviation: [Ir(dpo)$_2$(acac)]), bis{2-[4'-(perfluorophenyl)phenyl]pyridinato-N,C$^{2'}$}iridium(III) acetyl acetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]).

The following substances can be given as examples of a phosphorescent substance which emits yellow, orange, or red light and whose emission spectrum has a peak wavelength at greater than or equal to 570 nm and less than or equal to 750 nm. (For example, a peak wavelength at greater than or equal to 570 nm and less than or equal to 590 nm is preferable in the case of yellow light, a peak wavelength at greater than or equal to 590 nm and less than or equal to 620 nm is preferable in the case of orange light, and a peak wavelength at greater than or equal to 600 nm and less than or equal to 750 nm is preferable in the case of red light.)

For example, organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and (dipivaloylmethanato)bis[4,6-di(naphthalen-1-yl)pyrimidinato]iridium(III) (abbreviation: [Ir(dlnpm)$_2$(dpm)]); organometallic complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis {4,6-dimethyl-2-[5-(4-cyano-2,6-dimethyl phenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-dmCP)$_2$(dpm)]), bis{4,6-dimethyl-2-[5-(5-cyano-2-methylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-m5CP)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), and (acetyl acetonato)bis[2,3-bis(4-fluorophenyl)quinoxalinato]iridium(III) (abbreviation: [Ir(Fdpq)$_2$(acac)]); organometallic complexes having a pyridine skeleton, such as tris(1-phenylisoquinolinato-N,C$^{2'}$)iridium(III) (abbreviation: [Ir(piq)$_3$]), bis(1-phenylisoquinolinato-N,C$^{2'}$)iridium(III) acetyl acetonate (abbreviation: [Ir(piq)$_2$(acac)]), and bis[4,6-dimethyl-2-(2-quinolinyl-κN)phenyl-κC](2,4-pentanedionato-κ$^2$O,O')iridium(III) (abbreviation: [Ir(dmpqn)$_2$(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoracetonato](monophenanthroline)europium(III) (abbreviation: [Eu(TTA)$_3$(Phen)]) can be given.

The following materials can be used as the TADF material that is a light-emitting substance that converts triplet excitation energy into light. The TADF material is a material that can up-convert a triplet excited state into a singlet excited state (reverse intersystem crossing) using a little thermal energy and efficiently exhibits light emission (fluorescence) from the singlet excited state. The thermally activated delayed fluorescence is efficiently obtained under the condition where the energy difference between the triplet excited level and the singlet excited level is greater than or equal to 0 eV and less than or equal to 0.2 eV, preferably greater than or equal to 0 eV and less than or equal to 0.1 eV. Note that delayed fluorescence by the TADF material refers to light emission having a spectrum similar to that of normal fluorescence and an extremely long lifetime. The lifetime is $1\times10^{-6}$ seconds or longer, preferably $1\times10^{-3}$ seconds or longer.

Specific examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

Alternatively, a heterocyclic compound having one or both of a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-tri azine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA), can also be used.

Note that a substance in which a t-electron rich heteroaromatic ring is directly bonded to a t-electron deficient heteroaromatic ring is particularly preferable because both the donor property of the t-electron rich heteroaromatic ring and the acceptor property of the t-electron deficient heteroaromatic ring are improved and the energy difference between the singlet excited state and the triplet excited state becomes small.

In the case where the above-described light-emitting substance (the light-emitting substance that converts singlet excitation energy into light in the visible light range (e.g., a fluorescent substance) or the light-emitting substance that converts triplet excitation energy into light in the visible light range (e.g., a phosphorescent substance or a TADF material)) is used in the light-emitting layer 113, the following organic compounds (some of them are the same as the above) are preferably used in addition to these light-emitting substances (the organic compounds) in terms of favorable combination.

First, in the case where the fluorescent substance is used as the light-emitting substance, it is preferable to use an organic compound of a condensed polycyclic aromatic compound or the like, such as an anthracene derivative, a tetracene derivative, a phenanthrene derivative, a pyrene derivative, a chrysene derivative, or a dibenzo[g,p]chrysene derivative, in combination.

Specific examples include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazol e (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N'-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenyl chrysene, N,N,N',N',N'',N'',N''',N'''-octaphenyldibenzo[g,p] chrysene-2,7,10,15-tetraamine (abbreviation: DBC1), 9-[4-(10-phenyl-9-anthracenyl)phenyl]-9H-carbazol e (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)-biphenyl-4'-yl}-anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl) tetracene.

Furthermore, in the case where the phosphorescent substance is used as the light-emitting substance, an organic compound having triplet excitation energy (energy difference between a ground state and a triplet excited state) higher than the triplet excitation energy of the light-emitting substance is preferably used in combination. Other than such an organic compound, the organic compound having high hole-transport property (the second organic compound) and the organic compound having high electron-transport property (the first organic compound) may be used in combination.

Furthermore, other than such an organic compound, a plurality of organic compounds that can form an exciplex (e.g., the first organic compound and the second organic compound, a first host material and a second host material, or a host material and an assist material) may be used. Note that in the case where a plurality of organic compound are used to form an exciplex, a combination of a compound that easily accepts holes (a hole-transport material) and a compound that easily accepts electrons (an electron-transport material) can form an exciplex efficiently, which is preferable. In addition, when a phosphorescent substance and an exciplex are included in a light-emitting layer, ExTET (Exciplex-Triplet Energy Transfer), which is energy transfer from an exciplex to a light-emitting substance, can be performed efficiently, increasing emission efficiency. Note that a fluorescent substance and an exciplex may be included in a light-emitting layer.

Any of the above materials may be used in combination with a low-molecular material or a high-molecular material. Specific examples of the high-molecular material include poly(2,5-pyridinediyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy). For the deposition, a known method (a vacuum evaporation method, a coating method, a printing method, or the like) can be used as appropriate.

<Electron-Transport Layer>

The electron-transport layer 114 is a layer transporting electrons, which are injected from the second electrode 102 through the electron-injection layer 115 to be described later, to the light-emitting layer 113. Note that the electron-transport layer 114 is a layer containing an electron-transport material. As the electron-transport material used for the electron-transport layer 114, a substance having an electron mobility of greater than or equal to $1 \times 10^{-6}$ $cm^2/Vs$ is preferable. Note that other substances can be used as long as they have a property of transporting more electrons than holes. The electron-transport layers (114, 114a, and 114b) each function even with a single-layer structure, but can improve the device characteristics when having a stacked-layer structure of two or more layers as needed.

A material having high electron-transport property, such as a 7c-electron deficient heteroaromatic compound, is preferable as the organic compound that can be used for the electron-transport layer 114. Examples of the 7c-electron deficient heteroaromatic compound include a compound having a benzofurodiazine skeleton in which a benzene ring as an aromatic ring is condensed with a furan ring of a furodiazine skeleton, a compound having a naphtofurodiazine skeleton in which a naphthyl ring as an aromatic ring is condensed with a furan ring of a furodiazine skeleton, a compound having a phenanthrofurodiazine skeleton in which a phenanthro ring as an aromatic ring is condensed with a furan ring of a furodiazine skeleton, a compound having a benzothienodiazine skeleton in which a benzene ring as an aromatic ring is condensed with a thieno ring of a thienodiazine skeleton, a compound having a naphthothienodiazine skeleton in which a naphthyl ring as an aromatic ring is condensed with a thieno ring of a thienodiazine skeleton, and a compound having a phenanthrothienodiazine skeleton in which a phenanthro ring as an aromatic ring is condensed with a thieno ring of a thienodiazine skeleton. Other examples include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a nitrogen-containing heteroaromatic compound.

Note that examples of the electron-transport material include 9-[(3'-dibenzothiophen-4-yl)biphenyl-3-yl]naphtho[1',2':4,5]furo[2,3-b]pyrazine (abbreviation: 9mDBtBPNfpr), 9-(9'-phenyl-3,3'-bi-9H-carbazol-9-yl)naphtho[1',2':4,5]furo[2,3-b]pyrazine (abbreviation: 9PCCzNfpr), 9-[3-(9'-phenyl-3,3'-bi-9H-carbazol-9-yl)phenyl]naphtho[1',2': 4,5]furo[2,3-b]pyrazine (abbreviation: 9mPCCzNfpr), 9-[3-(9'-phenyl-2,3'-bi-9H-carbazol-9-yl)phenyl]naphtho[1',2': 4,5]furo[2,3-b]pyrazine (abbreviation: 9mPCCzNfpr-02), 10-[(3'-dibenzothiophen-4-yl)biphenyl-3-yl]naphtho[1',2': 4,5]furo[2,3-b]pyrazine (abbreviation: 10mDBtBPNfpr), 10-(9'-phenyl-3,3'-bi-9H-carbazol-9-yl)naphtho[1',2':4,5]furo[2,3-b]pyrazine (abbreviation: 10PCCzNfpr), 12-[(3'-dibenzothiophen-4-yl)biphenyl-3-yl]phenanthro[9',10': 4,5]furo[2,3-b]pyrazine (abbreviation: 12mDBtBPNfpr), 9-[4-(9'-phenyl-3,3'-bi-9H-carbazol-9-yl)phenyl]naphtho[1',2': 4,5]furo[2,3-b]pyrazine (abbreviation: 9pPCCzNfpr), 9-[4-(9'-phenyl-2,3'-bi-9H-carbazol-9-yl)phenyl]naphtho[1',2': 4,5]furo[2,3-b]pyrazine (abbreviation: 9pPCCzNfpr-02), 9-[3'-(6-phenylbenzo[b]naphtho[1,2-d]furan-8-yl)biphenyl-3-yl]naphtho[1',2': 4,5]furo[2,3-b]pyrazine (abbreviation: 9mBnfBPNfpr), 9-[3'-(6-phenyl dib enzothiophen-4-yl)biphenyl-3-yl]naphtho[1',2': 4,5]furo[2,3-b]pyrazine (abbreviation: 9mDBtBPNfpr-02), 9-{3-[6-(9,9-dimethylfluoren-2-yl)dib enzothiophen-4-yl]phenyl}naphtho[1',2': 4,5]furo[2,3-b]pyrazine (abbreviation: 9mFDBtPNfpr), 11-(3-naphtho[1',2': 4,5]furo[2,3-b]pyrazin-9-yl-phenyl)-12-phenylindolo[2,3-a]carbazole (abbreviation: 9mIcz(II)PNfpr), 3-naphtho[1',2': 4,5]furo[2,3-b]pyrazin-9-yl-N,N'-diphenylbenzenamine (abbreviation: 9mTPANfpr), 10-[4-(9'-phenyl-3,3'-bi-9H-carbazol-9-yl)phenyl]naphtho[1',2': 4,5]furo[2,3-b]pyrazine (abbreviation: 10mPCCzNfpr), 11-[(3'-(dibenzothiophen-4-yl)biphenyl-3-yl]phenanthro[9',10': 4,5]furo[2,3-b]pyrazine (abbreviation: 11mDBtBPPnfpr), 10-[3-(9'-phenyl-3,3'-bi-9H-carbazol-9-yl)phenyl]naphtho[1',2': 4,5]furo[2,3-b]pyrazine (abbreviation: 10pPCCzPNfpr), 9-[3-(7H-dibenzo[c,g]carbazol-7-yl)phenyl]naphtho[1',2': 4,5]furo[2,3-b]pyrazine (abbreviation: 9mcgDBCzPNfpr), 9-{3'-[6-(biphenyl-3-yl)dibenzothiophen-4-yl]biphenyl-3-yl}naphtho[1',2': 4,5]furo[2,3-b]pyrazine (abbreviation: 9mDBtBPNfpr-03), 9-{3'-[6-(biphenyl-4-yl)dibenzothiophen-4-yl]biphenyl-3-yl}naphtho[1',2': 4,5]furo[2,3-b]pyrazine (abbreviation: 9mDBtBPNfpr-04), and 11-[3'-(6-phenyldibenzothiophen-4-yl)biphenyl-3-yl]phenanthro[9',10': 4,5]furo[2,3-b]pyrazine (abbreviation: 11mDBtBPPnfpr-02).

Alternatively, 4-[3-(dibenzothiophen-4-yl)phenyl]-8-(naphthalen-2-yl)-[1]benzofuro[3,2-d]pyrimidine (abbreviation: 8βN-4mDBtPBfpm), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 4,8-bis[3-(dibenzothiophen-4-yl)phenyl]411 benzofuro[3,2-d]pyrimidine (abbreviation: 4,8mDBtP2Bfpm), 8-[(2,2'-binaphthalen)-6-yl]-4-[3-(dibenzothiophen-4-yl)phenyl-[1]benzofuro[3,2-d]pyrimidine (abbreviation: 8(βN2)-4mDBtPBfpm), 3,8-bis[3-(dibenzothiophen-4-yl)phenyl]benzofuro[2,3-b]pyrazine (abbreviation: 3,8mDBtP2Bfpr), 8-[3'-(dibenzothiophen-4-yl)(1,1'-biphenyl-3-yl)]naphtho[1',2':4,5]furo[3,2-d]pyrimidine (abbreviation: 8mDBtBPNfpm), or the like can be used.

Further alternatively, a metal complex having a quinoline skeleton or a benzoquinoline skeleton, such as tris(8-quinolinolato)aluminum(III) (abbreviation: Alq$_3$), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), or bis(8-quinolinolato)zinc (II) (abbreviation: Znq), a metal complex having an oxazole skeleton or a thiazole skeleton, such as bis[2-(2-benzoxazolyl)phenolato]zinc(II) (abbreviation: ZnPBO), bis[2-(2-benzothiazolyl)phenolato]zinc(II) (abbreviation: ZnBTZ), and bis[2-(2-hydroxyphenyl)benzothiazolato]zinc(II) (abbreviation: Zn(BTZ)$_2$), or the like can be used.

Still further alternatively, any of the following can be used: an oxadiazole derivative such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), or 9-[4-(5-phenyl-1,3,4-oxadiazol-2-yl)phenyl]-9H-carbazole (abbreviation: CO11); a triazole derivative such as 3-(4-biphenylyl)-4-phenyl-5-(4-tert-butylphenyl)-1,2,4-triazole (abbreviation: TAZ) or 3-(4-tert-butylphenyl)-4-(4-ethylphenyl)-5-(4-biphenylyl)-1,2,4-triazole (abbreviation: p-EtTAZ); an imidazole derivative (including a benzimidazole derivative) such as 2,2',2"-(1,3,5-benzenetriyl)tris(1-phenyl-1H-benzimidazole) (abbreviation: TPBI) or 2-[3-(dibenzothiophen-4-yl)phenyl]-1-phenyl-1H-benzimidazole (abbreviation: mDBTBIm-II); an oxazole derivative such as 4,4'-bis(5-methylbenzoxazol-2-yl)stilbene (abbreviation: BzOs); a phenanthroline derivative such as bathophenanthroline (abbreviation: Bphen), bathocuproine (abbreviation: BCP), or 2,9-bis(naphthalen-2-yl)-4,7-diphenyl-1,10-phenanthroline (abbreviation: NBphen); a quinoxaline derivative or a dibenzoquinoxaline derivative such as 2-[3-(dibenzothiophen-4-yl)phenyl]dibenzo[f,h]quinoxaline (abbreviation: 2mDBTPDB q-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDB q), 2-[4-(3,6-diphenyl-9H-carbazol-9- yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), or 6-[3-(dibenzothiophen-4-yl)phenyl]dibenzo[f,h]quinoxaline (abbreviation: 6mDBTPDBq-II); a pyridine derivative such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB); a pyrimidine derivative such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,6-bis[3-(9H-carbazol-9-yl)phenyl]pyrimidine (abbreviation: 4,6mCzP2Pm); and a triazine derivative such as 2-{4-[3-(N-phenyl-9H-carbazol-3-yl)-9H-carbazol-9-yl]phenyl}-4,6-diphenyl-1,3,5-tri azine (abbreviation: PCCzPTzn), mPCCzPTzn-02, 9-[3-(4,6-diphenyl-1,3,5-triazin-2-yl)phenyl]-9'-phenyl-2,3'-bi-9H-carbazole (abbreviation: mPCCzPTzn-02), 5-[3-(4,6-diphenyl-1,3,5-triazin-2-yl)phenyl]-7,7-dimethyl-5H,7H-indeno[2,1-b]carbazole (abbreviation: mINc(II)PTzn), or 2-{3-[3-(dibenzothiophen-4-yl)phenyl]phenyl}-4,6-diphenyl-1,3,5-triazine (abbreviation: mDBtBPTzn).

It is also possible to use a high-molecular compound such as PPy, PF-Py, or PF-BPy.

<Electron-Injection Layer>

The electron-injection layer 115 is a layer for increasing the efficiency of electron injection from the cathode 102; thus, the electron-injection layer 115 is preferably formed using a material whose LUMO level value has a small difference (0.5 eV or less) from the work function value of the cathode 102. Thus, the electron-injection layer 115 can be formed using an alkali metal, an alkaline earth metal, or a compound thereof, such as lithium, cesium, lithium fluoride (LiF), cesium fluoride (CsF), calcium fluoride ($CaF_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate. A rare earth metal compound like erbium fluoride ($ErF_3$) can also be used.

Figure 1B:
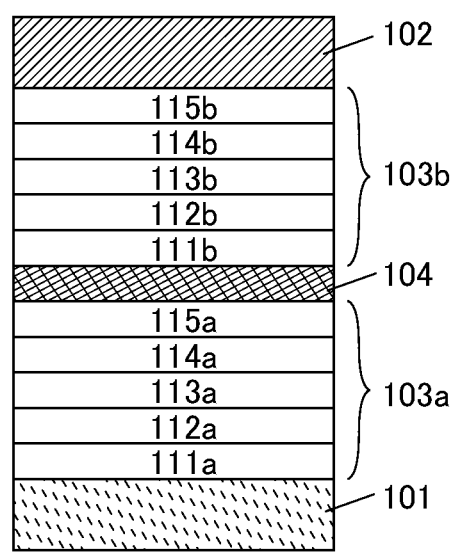
Figure 8A:
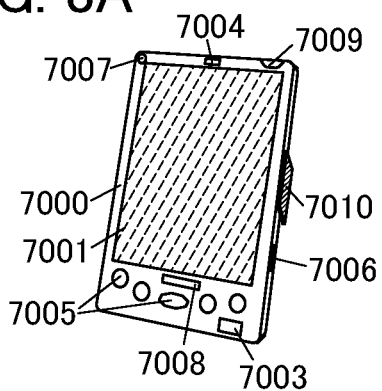
FIG. 8A, FIG. 8B, FIG. 8C, FIG. 8D, FIG. 8E, FIG. 8F, and FIG. 8G illustrate electronic devices.
Figure 8B:
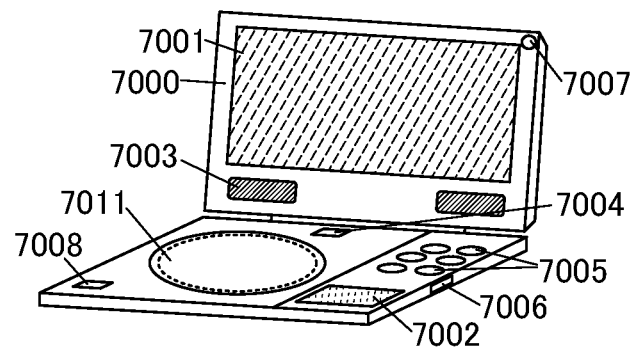

When a charge-generation layer 104 is provided between two EL layers (103a and 103b) as in the light-emitting device illustrated in FIG. 1B, a structure in which a plurality of EL layers are stacked between the pair of electrodes (also referred to as a tandem structure) can be employed. Note that in this embodiment, functions and materials of the hole-injection layer (111), the hole-transport layer (112), the light-emitting layer (113), the electron-transport layer (114), and the electron-injection layer (115) that are illustrated in FIG. 8A are the same as those of hole-injection layers (111a and 111b), hole-transport layers (112a and 112b), light-emitting layers (113a and 113b), the electron-transport layers (114a and 114b), and electron-injection layers (115a and 115b) that are illustrated in FIG. 8B.

<Charge-Generation Layer>

In the light-emitting device of FIG. 1B, the charge-generation layer 104 has a function of injecting electrons into the EL layer 103a and injecting holes into the EL layer 103b when voltage is applied between the first electrode (anode) 101 and the second electrode (cathode) 102. Note that the charge-generation layer 104 may have either a structure in which an electron acceptor (acceptor) is added to a hole-transport material or a structure in which an electron donor (donor) is added to an electron-transport material. Alternatively, both of these structures may be stacked. Note that forming the charge-generation layer 104 with the use of any of the above materials can suppress an increase in drive voltage in the case where the EL layers are stacked.

In the case where the charge-generation layer 104 has a structure in which an electron acceptor is added to a hole-transport material, any of the materials described in this embodiment can be used as the hole-transport material. As the electron acceptor, 7,7,8,8-tetracyano-2,3,5,6-tetrafluoro-quinodimethane (abbreviation: $F_4$-TCNQ), chloranil, and the like can be given. Other examples include oxides of metals belonging to Group 4 to Group 8 of the periodic table. Specific examples are vanadium oxide, niobium oxide, tantalum oxide, chromium oxide, molybdenum oxide, tungsten oxide, manganese oxide, and rhenium oxide.

In the case where the charge-generation layer 104 has a structure in which an electron donor is added to an electron-transport material, any of the materials described in this embodiment can be used as the electron-transport material. As the electron donor, it is possible to use an alkali metal, an alkaline earth metal, a rare earth metal, metals belonging to Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

Although FIG. 1B illustrates the structure in which two EL layers 103 are stacked, a structure may be employed in which three or more EL layers are stacked with a charge-generation layer provided between different EL layers. The light-emitting layers 113 (113a and 113b) included in the EL layers (103, 103a, and 103b) each include an appropriate combination of a light-emitting substance and a plurality of substances, so that fluorescence or phosphorescence of a desired emission color can be obtained. In the case where a plurality of light-emitting layers 113 (113a and 113b) are provided, emission colors of the respective light-emitting layers may be different from each other. In that case, light-emitting substances and other substances are different between the stacked light-emitting layers. For example, the light-emitting layer 113a can be blue, and the light-emitting layer 113b can be red, green, or yellow; for another example, the light-emitting layer 113a can be red, and the light-emitting layer 113b can be blue, green, or yellow. Furthermore, in the case where three or more EL layers are stacked, the light-emitting layer (113a) of the first EL layer can be blue, the light-emitting layer (113b) of the second EL layer can be red, green, or yellow, and a light-emitting layer of the third EL layer can be blue. For another example, the light-emitting layer (113a) of the first EL layer can be red, the light-emitting layer (113b) of the second EL layer can be blue, green, or yellow, and the light-emitting layer of the third EL layer can be red. Note that another combination of emission colors can be employed as appropriate in consideration of luminance and characteristics of the plurality of emission colors.

<Substrate>

The light-emitting device described in this embodiment can be formed over any of a variety of substrates. Note that the type of the substrate is not limited to a certain type. Examples of the substrate include semiconductor substrates (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Note that examples of the glass substrate include barium borosilicate glass, aluminoborosilicate glass, and soda lime glass. Examples of the flexible substrate, the attachment film, and the base material film include plastics typified by polyethylene terephthalate (PET), polyethylene naphthalate (PEN), and polyether sulfone (PES); a synthetic resin such as an acrylic resin; polypropylene; polyester; polyvinyl fluoride; polyvinyl chloride; polyamide; polyimide; an aramid resin; an epoxy resin; an inorganic vapor deposition film; and paper.

For fabrication of the light-emitting device in this embodiment, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers (111, 111a, and 111b), the hole-transport layers (112, 112a, and 112b), the light-emitting layers (113, 113a, and 113b), the electron-transport layers (114, 114a, and 114b), the electron-injection layers (115, 115a, and 115b), and the charge-generation layers (104, 104a, and 104b)) included in the EL layers of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, a micro-contact printing method, or a nanoimprinting method), or the like.

Note that in the case where the functional layer included in the EL layer of the light-emitting device is formed using the composition for a light-emitting device of one embodiment of the present invention, it is particularly preferable to employ an evaporation method. For example, in the case where three kinds of materials (the light-emitting substance, the first organic compound, and the second organic compound) are used for forming the light-emitting layer (113, 113a, or 113b), the same number of evaporation sources (three in this case) as the number of materials to be evaporated are used, a first organic compound 401, a second organic compound 402, and a light-emitting substance 403 are put in the respective evaporation sources and co-evaporation is performed; thus, the light-emitting layer (113, 113a, or 113b) that is a mixed film of the three kinds of evaporation materials is formed over a surface of a substrate 400. In the case where the composition for a light-emitting device in which the first organic compound and the second organic compound of the three kinds of materials are mixed is used, two kinds of evaporation sources are used even though three kinds of materials are used for forming the light-emitting layer (113, 113a, or 113b), a composition 404 for a light-emitting device and a light substance 405 are put in the respective evaporation sources and co-evaporation is performed; thus, the light-emitting layer (113, 113a, or 113b) that is a mixed film the same as the mixed film formed using three kinds of evaporation sources can be formed.

The composition for a light-emitting device is obtained by mixing a compound having a specific molecular structure as described in Embodiment 1; therefore, even though a plurality of unspecific compounds are mixed to be put in one evaporation source and evaporation is performed, it is difficult to obtain a film with a quality substantially the same as that in the case where the compounds are put in different evaporation sources and co-evaporation is performed. For example, there arise problems in that composition is changed because part of the mixed material is deposited first, a film with desired quality (e.g., composition and film thickness) is not obtained, and the like. In addition, in the mass-producing process, troubles such as complexity of apparatus specifications and increase in effort for maintenance occur.

Thus, with the use of the composition for a light-emitting device of one embodiment of the present invention for part of an EL layer or a light-emitting layer, a highly productive light-emitting device can be manufactured while device characteristics and reliability of the light-emitting device are maintained, which can be said to be preferable.

Note that materials that can be used for the functional layers (the hole-injection layers (111, 111a, and 111b), the hole-transport layers (112, 112a, and 112b), the light-emitting layers (113, 113a, 113b, and 113c), the electron-transport layers (114, 114a, and 114b), the electron-injection layers (115, 115a, and 115b), and the charge-generation layers (104, 104a, and 104b)) included in the EL layers (103, 103a, and 103b) of the light-emitting device described in this embodiment are not limited to the above materials, and other materials can also be used in combination as long as the functions of the layers are fulfilled. For example, a high molecular compound (e.g., an oligomer, a dendrimer, and a polymer), a middle molecular compound (a compound between a low molecular compound and a high molecular compound with a molecular mass of 400 to 4000), or an inorganic compound (e.g., a quantum dot material) can be used. As the quantum dot material, a colloidal quantum dot material, an alloyed quantum dot material, a core-shell quantum dot material, a core quantum dot material, or the like can be used.

The structure described in this embodiment can be used in an appropriate combination with any of the structures described in the other embodiments.

Embodiment 2

In this embodiment, a light-emitting apparatus of one embodiment of the present invention will be described.

The use of the device structure of the light-emitting device of one embodiment of the present invention allows fabrication of an active-matrix light-emitting apparatus or a passive-matrix light-emitting apparatus. Note that an active-matrix light-emitting apparatus has a structure including a combination of a light-emitting device and a transistor (FET). Thus, each of a passive-matrix light-emitting apparatus and an active-matrix light-emitting apparatus is included in one embodiment of the present invention. Note that any of the light-emitting devices described in the other embodiments can be used in the light-emitting apparatus described in this embodiment.

In this embodiment, an active-matrix light-emitting apparatus will be described with reference to FIG. 7.

Figure 7A:
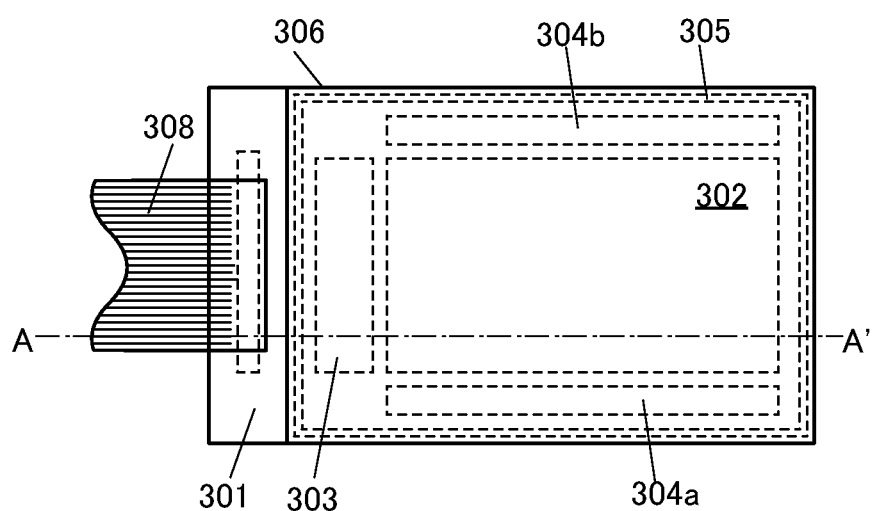
FIG. 7A and FIG. 7B illustrate a light-emitting apparatus.
Figure 7B:
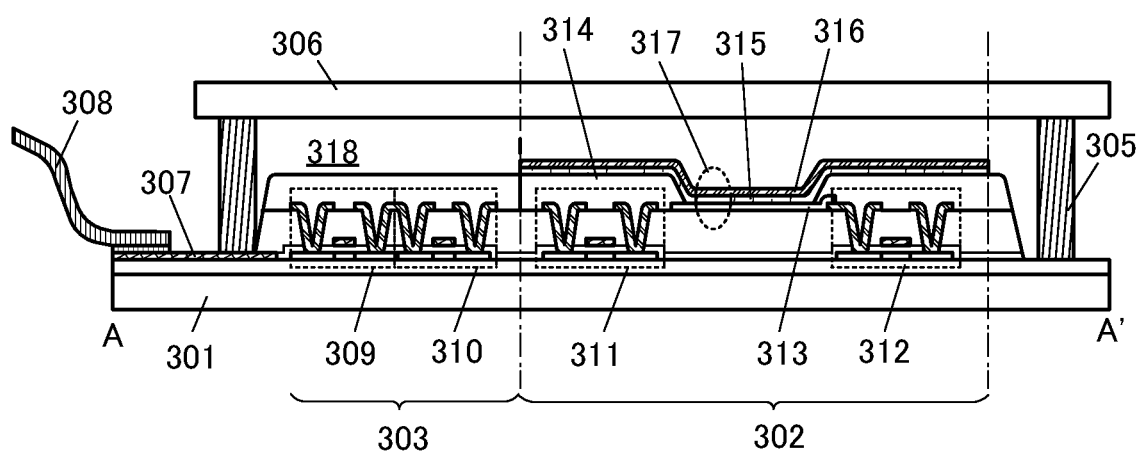

FIG. 7A is a top view illustrating a light-emitting apparatus, and FIG. 7B is a cross-sectional view taken along a chain line AA' in FIG. 7A. The active-matrix light-emitting apparatus includes a pixel portion 302, a driver circuit portion (source line driver circuit) 303, and driver circuit portions (gate line driver circuits) (304a and 304b) that are provided over a first substrate 301. The pixel portion 302 and the driver circuit portions (303, 304a, and 304b) are sealed between the first substrate 301 and a second substrate 306 with a sealant 305.

A lead wiring 307 is provided over the first substrate 301. The lead wiring 307 is electrically connected to an FPC 308 that is an external input terminal. Note that the FPC 308 transmits a signal (e.g., a video signal, a clock signal, a start signal, or a reset signal) or a potential from the outside to the driver circuit portions (303, 304a, and 304b). The FPC 308 may be provided with a printed wiring board (PWB). Note that the light-emitting apparatus provided with an FPC or a PWB is included in the category of a light-emitting apparatus.

Next, FIG. 7B illustrates a cross-sectional structure.

The pixel portion 302 is made up of a plurality of pixels each of which includes an FET (switching FET) 311, an FET (current control FET) 312, and a first electrode 313 electrically connected to the FET 312. Note that the number of FETs included in each pixel is not particularly limited and can be set appropriately as needed.

As FETs 309, 310, 311, and 312, for example, a staggered transistor or an inverted staggered transistor can be used without particular limitation. A top-gate transistor, a bottom-gate transistor, or the like may be used.

Note that there is no particular limitation on the crystallinity of a semiconductor that can be used for the FETs 309, 310, 311, and 312, and an amorphous semiconductor or a semiconductor having crystallinity (a microcrystalline semiconductor, a polycrystalline semiconductor, a single crystal semiconductor, or a semiconductor partly including crystal regions) may be used. The use of a semiconductor having crystallinity can suppress deterioration of the transistor characteristics, which is preferable.

For these semiconductors, a Group 14 element, a compound semiconductor, an oxide semiconductor, an organic semiconductor, or the like can be used, for example. Typically, a semiconductor containing silicon, a semiconductor containing gallium arsenide, an oxide semiconductor containing indium, or the like can be used.

The driver circuit portion 303 includes the FET 309 and the FET 310. The FET 309 and the FET 310 may be formed with a circuit including transistors having the same conductivity type (either n-channel transistors or p-channel transistors) or a CMOS circuit including an n-channel transistor and a p-channel transistor. Furthermore, a structure including a driver circuit outside may be employed.

An end portion of the first electrode 313 is covered with an insulator 314. For the insulator 314, an organic compound such as a negative photosensitive resin or a positive photosensitive resin (acrylic resin), or an inorganic compound such as silicon oxide, silicon oxynitride, or silicon nitride can be used. An upper end portion or a lower end portion of the insulator 314 preferably has a curved surface with curvature. In that case, favorable coverage with a film formed over the insulator 314 can be obtained.

An EL layer 315 and a second electrode 316 are stacked over the first electrode 313. The EL layer 315 includes a light-emitting layer, a hole-injection layer, a hole-transport layer, an electron-transport layer, an electron-injection layer, a charge-generation layer, and the like.

The structure and materials described in any of the other embodiments can be used for the structure of a light-emitting device 317 described in this embodiment. Although not illustrated here, the second electrode 316 is electrically connected to the FPC 308 that is an external input terminal.

Although the cross-sectional view illustrated in FIG. 7B illustrates only one light-emitting device 317, a plurality of light-emitting devices are arranged in a matrix in the pixel portion 302. Light-emitting devices from which light of three kinds of colors (R, G, and B) are obtained are selectively formed in the pixel portion 302, whereby a light-emitting apparatus capable of full-color display can be formed. In addition to the light-emitting devices from which light of three kinds of colors (R, G, and B) are obtained, for example, light-emitting devices from which light of white (W), yellow (Y), magenta (M), cyan (C), and the like are obtained may be formed. For example, the light-emitting devices from which light of some of the above colors are obtained are added to the light-emitting devices from which light of three kinds of colors (R, G, and B) are obtained, whereby effects such as an improvement in color purity and a reduction in power consumption can be obtained. Alternatively, a light-emitting apparatus capable of full-color display may be fabricated by a combination with color filters. As the kinds of color filters, red (R), green (G), blue (B), cyan (C), magenta (M), yellow (Y), and the like can be used.

When the second substrate 306 and the first substrate 301 are bonded to each other with the sealant 305, the FETs (309, 310, 311, and 312) and the light-emitting device 317 over the first substrate 301 are provided in a space 318 surrounded by the first substrate 301, the second substrate 306, and the sealant 305. Note that the space 318 may be filled with an inert gas (e.g., nitrogen or argon) or an organic substance (including the sealant 305).

An epoxy resin or glass frit can be used for the sealant 305. It is preferable to use a material that is permeable to as little moisture and oxygen as possible for the sealant 305. As the second substrate 306, a material that can be used as the first substrate 301 can be similarly used. Thus, any of the various substrates described in the other embodiments can be appropriately used. As the substrate, a glass substrate, a quartz substrate, or a plastic substrate made of FRP (Fiber-Reinforced Plastics), PVF (polyvinyl fluoride), polyester, an acrylic resin, or the like can be used. In the case where glass frit is used for the sealant, the first substrate 301 and the second substrate 306 are preferably glass substrates in terms of adhesion.

In the above manner, the active-matrix light-emitting apparatus can be obtained.

In the case where the active-matrix light-emitting apparatus is formed over a flexible substrate, the FETs and the light-emitting device may be directly formed over the flexible substrate; alternatively, the FETs and the light-emitting device may be formed over a substrate provided with a separation layer and then separated at the separation layer by application of heat, force, laser irradiation, or the like to be transferred to a flexible substrate. For the separation layer, a stack including inorganic films such as a tungsten film and a silicon oxide film, or an organic resin film of polyimide or the like can be used, for example. Examples of the flexible substrate include, in addition to a substrate over which a transistor can be formed, a paper substrate, a cellophane substrate, an aramid film substrate, a polyimide film substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. With the use of any of these substrates, high durability, high heat resistance, a reduction in weight, and a reduction in thickness can be achieved.

The light-emitting device included in the active-matrix light-emitting apparatus may be driven with a structure in which pulsed light (with a frequency of kHz or MHz, for example) emitted from the light-emitting device is used for display. The light-emitting device formed using any of the above organic compounds has excellent frequency characteristics; thus, time for driving the light-emitting device can be shortened, and thus the power consumption can be reduced. Furthermore, a reduction in driving time leads to inhibition of heat generation, so that the degree of deterioration of the light-emitting device can be reduced.

Note that the structures described in this embodiment can be used in an appropriate combination with the structures described in the other embodiments.

Embodiment 3

In this embodiment, examples of a variety of electronic devices and an automobile completed using the light-emitting device of one embodiment of the present invention or a light-emitting apparatus including the light-emitting device of one embodiment of the present invention are described. Note that the light-emitting apparatus can be used mainly in a display portion of the electronic device described in this embodiment.

Electronic devices illustrated in FIG. 8A to FIG. 8E can include a housing 7000, a display portion 7001, a speaker 7003, an LED lamp 7004, operation keys 7005 (including a power switch or an operation switch), a connection terminal 7006, a sensor 7007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 7008, and the like.

FIG. 8A is a mobile computer which can include a switch 7009, an infrared port 7010, and the like in addition to the above components.

FIG. 8B is a portable image reproducing device (e.g., a DVD player) which is provided with a recording medium and can include a second display portion 7002, a recording medium reading portion 7011, and the like in addition to the above components.

Figure 8C:
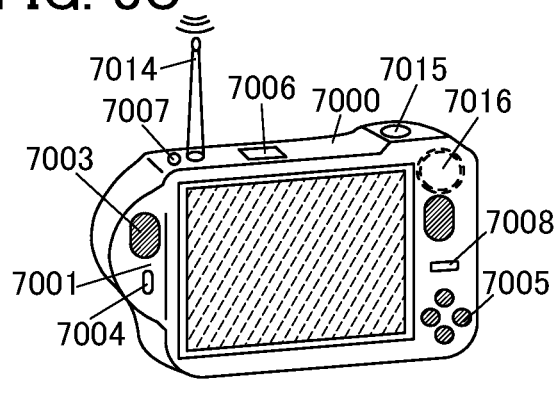

FIG. 8C is a digital camera with a television reception function, which can include an antenna 7014, a shutter button 7015, an image receiving portion 7016, and the like in addition to the above components.

Figure 8D:
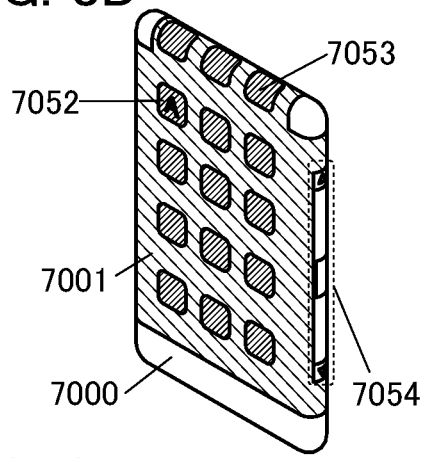

FIG. 8D is a portable information terminal. The portable information terminal has a function of displaying information on three or more surfaces of the display portion 7001. Here, an example in which information 7052, information 7053, and information 7054 are displayed on different surfaces is shown. For example, the user can check the information 7053 displayed in a position that can be observed from above the portable information terminal, with the portable information terminal put in a breast pocket of his/her clothes. The user can see the display without taking out the portable information terminal from the pocket and decide whether to answer the call, for example.

Figure 8E:
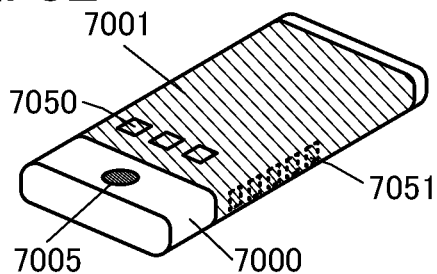

FIG. 8E is a portable information terminal (including a smartphone) and can include the display portion 7001, the operation key 7005, and the like in the housing 7000. Note that a speaker 9003, the connection terminal 7006, a sensor 9007, or the like may be provided in the portable information terminal. The portable information terminal can display characters and image information on its plurality of surfaces. Here, an example is shown in which three icons 7050 are displayed. Information 7051 indicated by dashed rectangles can be displayed on another surface of the display portion 7001. Examples of the information 7051 include notification of reception of an e-mail, SNS, or an incoming call, the title and sender of an e-mail, SNS, or the like, the date, the time, remaining battery, and the reception strength of an antenna. Alternatively, the icon 7050 or the like may be displayed in the position where the information 7051 is displayed.

Figure 8F:
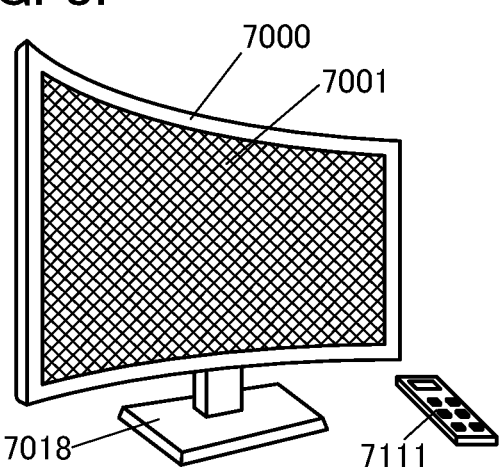

FIG. 8F is a large-size television set (also referred to as TV or a television receiver), which can include the housing 7000, the display portion 7001, and the like. In addition, shown here is a structure where the housing 7000 is supported by a stand 7018. The television set can be operated with a separate remote controller 7111 or the like. Note that the display portion 7001 may include a touch sensor, in which case the television set may be operated by touch on the display portion 7001 with a finger or the like. The remote controller 7111 may include a display portion for displaying data output from the remote controller 7111. With operation keys or a touch panel provided in the remote controller 7111, channels and volume can be operated and images displayed on the display portion 7001 can be operated.

The electronic devices illustrated in FIG. 8A to FIG. 8F can have a variety of functions. For example, they can have a function of displaying a variety of data (e.g., a still image, a moving image, and a text image) on the display portion, a touch panel function, a function of displaying a calendar, date, time, or the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image data mainly on one display portion while displaying text data mainly on the other display portion, a function of displaying a three-dimensional image by displaying images on a plurality of display portions with a parallax taken into account, or the like. Furthermore, the electronic device including an image receiving portion can have a function of taking a still image, a function of taking a moving image, a function of automatically or manually correcting a taken image, a function of storing a taken image in a recording medium (external or incorporated in the camera), a function of displaying a taken image on the display portion, or the like. Note that functions that the electronic devices illustrated in FIG. 8A to FIG. 8F can have are not limited to those, and the electronic devices can have a variety of functions.

Figure 8G:
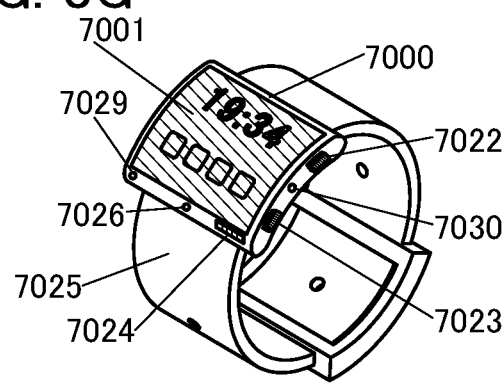

FIG. 8G is a watch-type portable information terminal, which can be used as a smart watch, for example. The watch-type portable information terminal includes the housing 7000, the display portion 7001, operation buttons 7022 and 7023, a connection terminal 7024, a band 7025, a microphone 7026, a sensor 7029, a speaker 7030, and the like. The display surface of the display portion 7001 is curved, and display can be performed along the curved display surface. Furthermore, the portable information terminal enables hands-free calling by mutually communicating with, for example, a headset capable of wireless communication. With the connection terminal 7024, the portable information terminal can perform mutual data transmission with another information terminal and charging. Wireless power feeding can also be employed for the charging operation.

The display portion 7001 mounted in the housing 7000 also serving as a bezel includes a non-rectangular display region. The display portion 7001 can display an icon 7027 indicating time, another icon 7028, and the like. The display portion 7001 may be a touch panel (input/output device) including a touch sensor (input device).

Note that the smart watch illustrated in FIG. 8G can have a variety of functions. For example, the smart watch can have a function of displaying a variety of data (e.g., a still image, a moving image, and a text image) on the display portion, a touch panel function, a function of displaying a calendar, date, time, or the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

Moreover, a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like can be included inside the housing 7000.

Note that the light-emitting apparatus of one embodiment of the present invention can be used in the display portions of the electronic devices described in this embodiment, enabling the electronic devices to have a long lifetime.

Figure 9A:
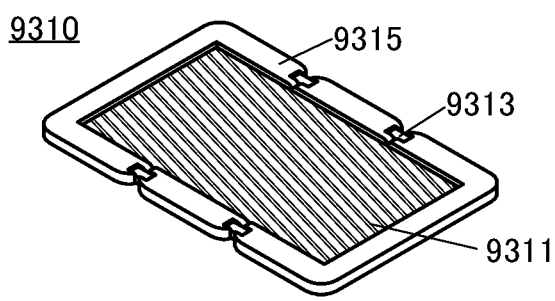
FIG. 9A, FIG. 9B, and FIG. 9C illustrate an electronic device.
Figure 9B:
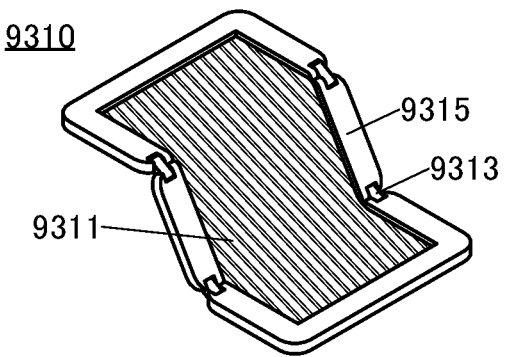
Figure 9C:
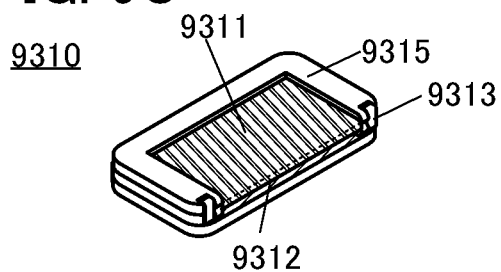

Another electronic device including the light-emitting apparatus is a foldable portable information terminal illustrated in FIG. 9A to FIG. 9C. FIG. 9A illustrates a portable information terminal 9310 which is opened. FIG. 9B illustrates the portable information terminal 9310 in a state in the middle of change from one of an opened state and a folded state to the other. FIG. 9C illustrates the portable information terminal 9310 which is folded. The portable information terminal 9310 is excellent in portability when folded, and is excellent in display browsability when opened because of a seamless large display region.

A display portion 9311 is supported by three housings 9315 joined together by hinges 9313. Note that the display portion 9311 may be a touch panel (input/output device) including a touch sensor (input device). By bending the display portion 9311 at a portion between two housings 9315 with the use of the hinges 9313, the portable information terminal 9310 can be reversibly changed in shape from an opened state to a folded state. The light-emitting apparatus of one embodiment of the present invention can be used for the display portion 9311. In addition, an electronic device having a long lifetime can be achieved. A display region 9312 in the display portion 9311 is a display region that is positioned at a side surface of the portable information terminal 9310 which is folded. On the display region 9312, information icons, file shortcuts of frequently used applications or programs, and the like can be displayed, and confirmation of information and start of an application can be smoothly performed.

Figure 10A:
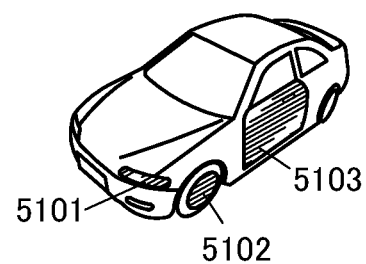
FIG. 10A and FIG. 10B illustrate an automobile.
Figure 10B:
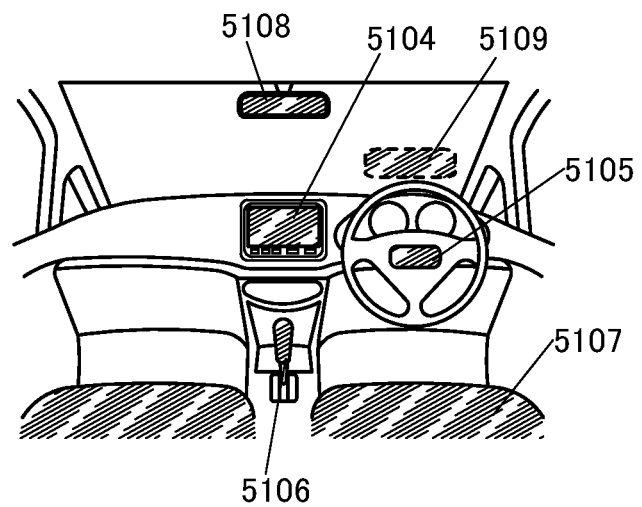

FIG. 10A and FIG. 10B illustrate an automobile including the light-emitting apparatus. In other words, the light-emitting apparatus can be integrated into an automobile. Specifically, the light-emitting apparatus can be applied to lights 5101 (including lights of the rear part of the automobile), a wheel 5102, a part or the whole of a door 5103, or the like on the outer side of the automobile which is illustrated in FIG. 10A. The light-emitting apparatus can also be applied to a display portion 5104, a steering wheel 5105, a shifter 5106, a seat 5107, an inner rearview mirror 5108, a windshield 5109, or the like on the inner side of the automobile which is illustrated in FIG. 10B. The light-emitting apparatus may be used for part of any of the other glass windows.

In the above manner, the electronic devices and automobiles in which the light-emitting apparatus of one embodiment of the present invention is used can be obtained. In that case, an electronic device having a long lifetime can be achieved. In addition, the light-emitting apparatus can be used for electronic devices and automobiles in a variety of fields without being limited to those described in this embodiment.

Note that the structures described in this embodiment can be used in an appropriate combination with any of the structures described in the other embodiments.

Embodiment 4

In this embodiment, a lighting device fabricated using the light-emitting apparatus of one embodiment of the present invention or the light-emitting device which is part of the light-emitting apparatus, or the application examples will be described. Note that the structure of the lighting device will be described with reference to FIG. 11.

Figure 11A:
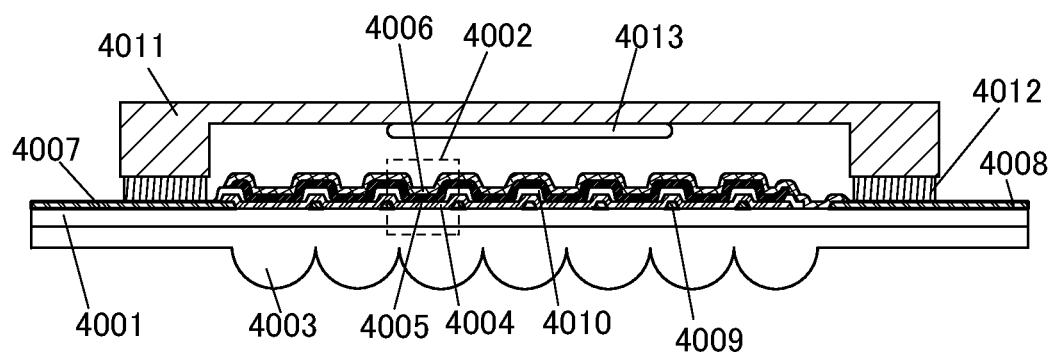
FIG. 11A and FIG. 11B illustrate lighting devices.
Figure 11B:
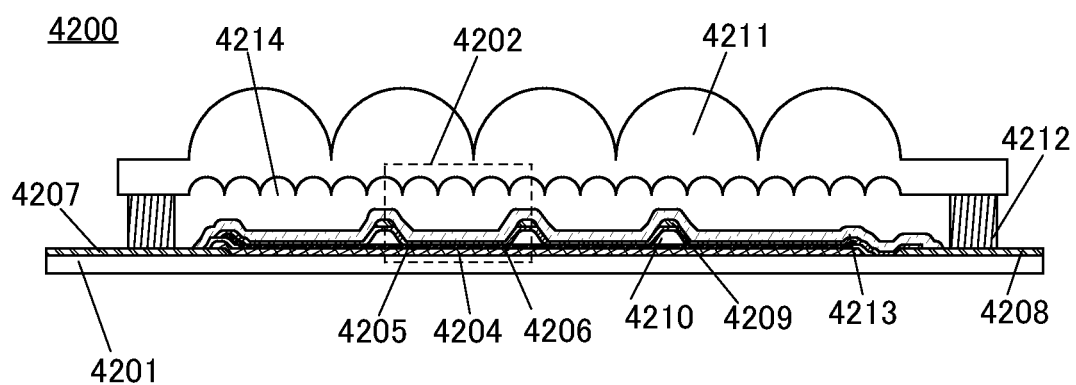

FIG. 11A and FIG. 11B each show an example of a cross-sectional view of a lighting device. FIG. 11A is a bottom-emission lighting device in which light is extracted from the substrate side, and FIG. 11B is a top-emission lighting device in which light is extracted from the sealing substrate side.

A lighting device 4000 illustrated in FIG. 11A includes a light-emitting device 4002 over a substrate 4001. In addition, the lighting device 4000 includes a substrate 4003 with unevenness on the outside of the substrate 4001. The light-emitting device 4002 includes a first electrode 4004, an EL layer 4005, and a second electrode 4006.

The first electrode 4004 is electrically connected to an electrode 4007, and the second electrode 4006 is electrically connected to an electrode 4008. In addition, an auxiliary wiring 4009 electrically connected to the first electrode 4004 may be provided. Note that an insulating layer 4010 is formed over the auxiliary wiring 4009.

The substrate 4001 and a sealing substrate 4011 are bonded to each other with a sealant 4012. A desiccant 4013 is preferably provided between the sealing substrate 4011 and the light-emitting device 4002. The substrate 4003 has the unevenness illustrated in FIG. 11A, whereby the extraction efficiency of light generated in the light-emitting device 4002 can be increased.

A lighting device 4200 illustrated in FIG. 11B includes a light-emitting device 4202 over a substrate 4201. The light-emitting device 4202 includes a first electrode 4204, an EL layer 4205, and a second electrode 4206.

The first electrode 4204 is electrically connected to an electrode 4207, and the second electrode 4206 is electrically connected to an electrode 4208. An auxiliary wiring 4209 electrically connected to the second electrode 4206 may also be provided. In addition, an insulating layer 4210 may be provided under the auxiliary wiring 4209.

The substrate 4201 and a sealing substrate 4211 with unevenness are bonded to each other with a sealant 4212. A barrier film 4213 and a planarization film 4214 may be provided between the sealing substrate 4211 and the light-emitting device 4202. The sealing substrate 4211 has the unevenness illustrated in FIG. 11B, whereby the extraction efficiency of light generated in the light-emitting device 4202 can be increased.

Application examples of such lighting devices include a ceiling light for indoor lighting. Examples of the ceiling light include a ceiling direct mount light and a ceiling embedded light. Such a lighting device is fabricated using the light-emitting apparatus in combination with a housing or a cover.

For another example, such lighting devices can be used for a foot light that illuminates a floor so that the safety of one's feet can be improved. For example, the foot light can be effectively used in a bedroom, on a staircase, or on a passage. In that case, the size or shape of the foot light can be changed depending on the area or structure of a room. The foot light can be a stationary lighting device fabricated using the light-emitting apparatus in combination with a support base.

Such lighting devices can also be used for a sheet-like lighting device (sheet-like lighting). The sheet-like lighting, which is attached to a wall when used, is space-saving and thus can be used for a wide variety of uses. Furthermore, the area of the sheet-like lighting can be easily increased. The sheet-like lighting can also be used on a wall or housing having a curved surface.

Besides the above examples, the light-emitting apparatus which is one embodiment of the present invention or the light-emitting device which is a part of the light-emitting apparatus can be used as part of furniture in a room, so that a lighting device which has a function of the furniture can be obtained. As described above, a variety of lighting devices that include the light-emitting apparatus of one embodiment of the present invention can be obtained.

Application examples fabricated using the light-emitting apparatus of one embodiment of the present invention or the light-emitting device which is part of the light-emitting apparatus include a light source for a face authentication sensor, a light source for a fingerprint authentication, a light source for a human sensor in a dark place, a light source for a vein sensor of a human body, a light source for a sensor measuring saturation degree of blood oxygen of a biologic body, a light source for measuring oxyhemoglobin concentration, and the like. Other than those, application examples taking advantage of the features of the light-emitting apparatus of one embodiment of the present invention or the light-emitting device which is a part of the light-emitting apparatus are embodiments of the present invention.

The structure described in this embodiment can be used in an appropriate combination with any of the structures described in the other embodiments.

Example 1

In this example, the light-emitting device of one embodiment of the present invention is fabricated, and the obtained element characteristics are described. Note that a light-emitting device 1 fabricated in this example is a light-emitting device with a microcavity structure that is adjusted to obtain light emission having a maximum peak wavelength of an emission spectrum at around 800 nm, and a light-emitting device 2 is a light-emitting device with a microcavity structure that is adjusted to obtain light emission having a maximum peak wavelength of an emission spectrum at around 855 nm.

Figure 12:
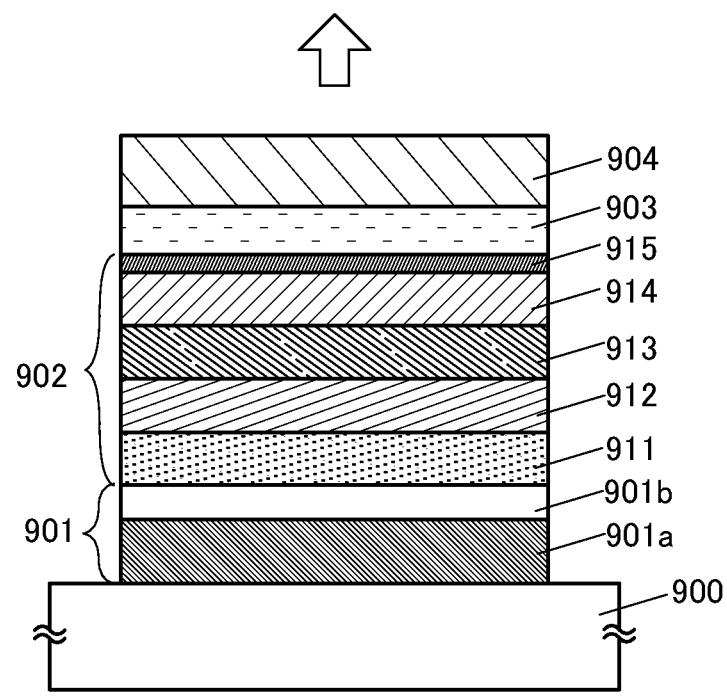
FIG. 12 illustrates a light-emitting device.

Specific element structures and fabrication methods of the above light-emitting devices will be described below. Note that FIG. 12 illustrates an element structure of the light-emitting devices described in this example, and Table 2 shows specific structures. Chemical formulae of materials used in this example are shown below.

TABLE 2

| | First electrode 901 | Hole-injection layer 911 | Hole-transport layer 912 | Light-emitting layer 913 | Electron-transport layer 914 | Electron-injection layer 915 | Second electrode 903 | Cap layer 904 |
|---|---|---|---|---|---|---|---|---|
| Light-emitting device 1 | APC (100 nm) | ITSO (10 nm) | DBT3P-II: MoOx (2:1 25 nm) | PCBBiF (20 nm) | * | 2mDBTBPDBq-II (20 nm) | NBphen (75 nm) LiF (1 nm) | Ag:Mg (10:1) (30 nm) | DBT3P-II (100 nm) |
| Light-emitting device 2 | APC (100 nm) | ITSO (10 nm) | DBT3P-II: MoOx (2:1 30 nm) | PCBBiF (20 nm) | * | 2mDBTBPDBq-II (20 nm) | NBphen (85 nm) LiF (1 nm) | Ag:Mg (10:1) (30 nm) | DBT3P-II (100 nm) |

* 2mDBTBPDBq-II:PCBBiF:[Ir(dmdpbq)$_2$(dpm)] (0.7:0.3:0.1 40 nm)

[Chemical Formula 5]

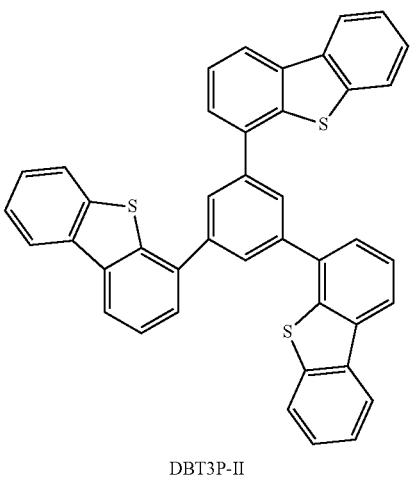

DBT3P-II

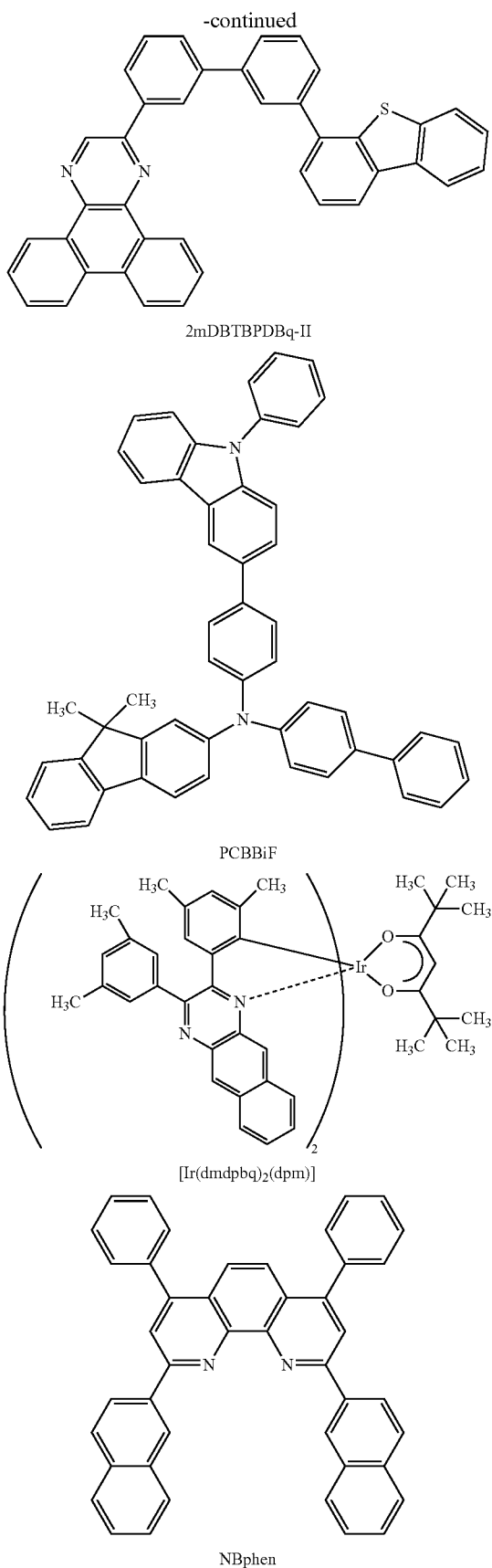

<<Fabrication of Light-Emitting Devices>>
<Fabrication of Light-Emitting Device 1 and Light-Emitting Device 2>

The light-emitting devices described in this example each have a structure, as illustrated in FIG. 12, in which a hole-injection layer 911, a hole-transport layer 912, a light-emitting layer 913, an electron-transport layer 914, and an electron-injection layer 915 are stacked in this order over a first electrode 901 formed over a substrate 900, and a second electrode 903 is stacked over the electron-injection layer 915.

First, the first electrode 901 was formed over the substrate 900. The electrode area was set to 4 mm² (2 mm×2 mm). A glass substrate was used as the substrate 900. The first electrode 901 was formed in such a manner that an alloy film of silver (Ag), palladium (Pd), and copper (Cu) (an Ag—Pd—Cu (APC) film) was formed as a reflective electrode to a thickness of 100 nm by a sputtering method, and a film of indium tin oxide containing silicon oxide (ITSO) was formed as a transparent electrode to a thickness of 10 nm by a sputtering method.

As pretreatment, a surface of the substrate was washed with water, baking was performed at 200° C. for one hour, and then UV ozone treatment was performed for 370 seconds. After that, the substrate was transferred into a vacuum evaporation apparatus in which the pressure was reduced to approximately 1×10⁻⁴ Pa, vacuum baking at 170° C. for 30 minutes was performed in a heating chamber in the vacuum evaporation apparatus, and then the substrate was cooled down for approximately 30 minutes.

Next, the hole-injection layer 911 was formed over the first electrode 901. For the formation of the hole-injection layer 911, the pressure in the vacuum evaporation apparatus was reduced to 1×10⁻⁴ Pa, and then 1,3,5-tri(dibenzothiophen-4-yl)benzene (abbreviation: DBT3P-II) and molybdenum oxide were co-evaporated such that DBT3P-II:molybdenum oxide=2:1 (mass ratio), the thickness was 25 nm in the light-emitting device 1, and the thickness was 30 nm in the light-emitting device 2.

Then, the hole-transport layer 912 was formed over the hole-injection layer 911. The hole-transport layer 912 was formed by evaporation using N-(1,1'-biphenyl-4-yl)-N-[4-(9-phenyl-9H-carbazol-3-yl)phenyl]-9,9-dimethyl-9H-fluoren-2-amine (abbreviation: PCBBiF) to a thickness of 20 nm.

Next, the light-emitting layer 913 was formed over the hole-transport layer 912.

The light-emitting layer 913 was formed by co-evaporation using bis{4,6-dimethyl-2-[3-(3,5-dimethylphenyl)-2-benzo[g]quinoxalinyl-κN]phenyl-κC}(2,2,6,6-tetramethyl-3,5-heptanedionato-κ²O,O')iridium(III) (abbreviation: [Ir(dmdpbq)₂(dpm)]) as a guest material (a phosphorescent material) in addition to 243'-(dibenzothiophen-4-yl)biphenyl-3-yldibenzo[f,h]quinoxaline (abbreviation: 2mDBTBPDBq-II) and PCBBiF so that the weight ratio was 2mDBTBPDBq-II:PCBBiF:[Ir(dmdpbq)₂(dpm)]=0.7:0.3:0.1. Note that the thickness was set to 40 nm.

Next, the electron-transport layer 914 was formed over the light-emitting layer 913.

The electron-transport layer 914 was formed in the following manner: 2mDBTBPDBq-II that is an electron-transport material was formed to a thickness of 20 nm by evaporation, and then evaporation using 2,9-bis(naphthalen-2-yl)-4,7-diphenyl-1,10-phenanthroline (abbreviation: NBPhen) that is an electron-transport material was performed so that the thickness was 75 nm in the light-emitting device 1, and the thickness was 85 nm in the light-emitting device 2.

Next, the electron-injection layer 915 was formed over the electron-transport layer 914. The electron-injection layer 915 was formed by evaporation using lithium fluoride (LiF) to a thickness of 1 nm.

After that, the second electrode 903 was formed over the electron-injection layer 915. The second electrode 903 was formed by evaporation so that the volume ratio of silver (Ag) to magnesium (Mg) was 1:0.1 to a thickness of 30 nm. Note that in this example, the second electrode 903 functions as a cathode and is a semi-transmissive and semi-reflective electrode having a function of reflecting light and a function of transmitting light. The light-emitting device described in this example is a top-emission light-emitting device in which light is extracted from the second electrode 903. In addition, an organic cap layer 904 was formed over the second electrode 903, whereby the extraction efficiency was improved. Note that a material whose refractive index is higher than or equal to 1.7 is preferably used as the organic cap layer 904, and DBT3P-II was evaporated to a thickness of 100 nm to form the organic cap layer 904 here.

Through the above steps, the light-emitting devices in each of which an EL layer was provided between a pair of electrodes over the substrate 900 were formed. The hole-injection layer 911, the hole-transport layer 912, the light-emitting layer 913, the electron-transport layer 914, and the electron-injection layer 915 described in the above steps are functional layers forming the EL layer in one embodiment of the present invention. Furthermore, in all the evaporation steps in the above fabrication method, an evaporation method by a resistance-heating method was used.

The light-emitting devices fabricated as described above were sealed using another substrate (not illustrated). At the time of the sealing using the another substrate (not illustrated), the another substrate (not illustrated) on which a sealant that solidifies by ultraviolet light was applied was fixed onto the substrate 900 in a glove box containing a nitrogen atmosphere, and the substrates were bonded to each other such that the sealant attached to the periphery of the light-emitting device formed over the substrate 900. At the time of the sealing, the sealant was irradiated with 365-nm ultraviolet light at 6 J/cm$^2$ to be solidified, and the sealant was subjected to heat treatment at 80° C. for one hour to be stabilized.

<<Operation Characteristics of Light-Emitting Devices>>

Figure 13:
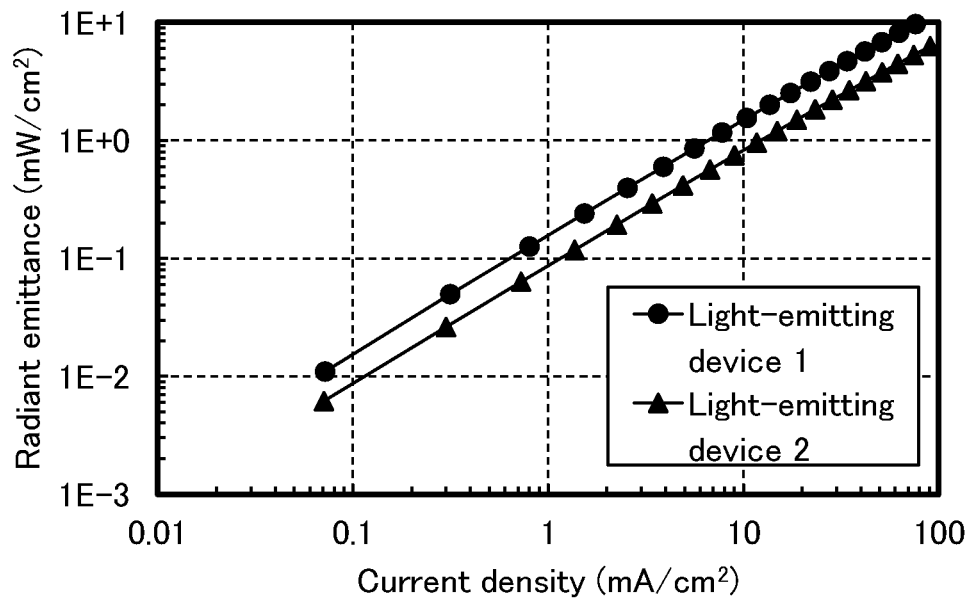
FIG. 13 shows current density-radiant emittance characteristics of a light-emitting device 1 and a light-emitting device 2.
Figure 14:
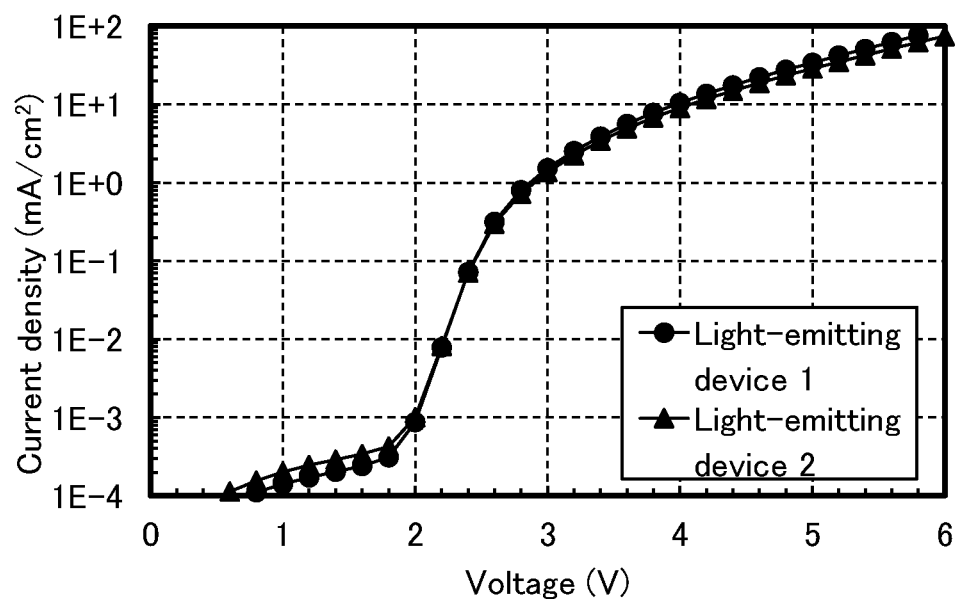
FIG. 14 shows voltage-current density characteristics of the light-emitting device 1 and the light-emitting device 2.
Figure 15:
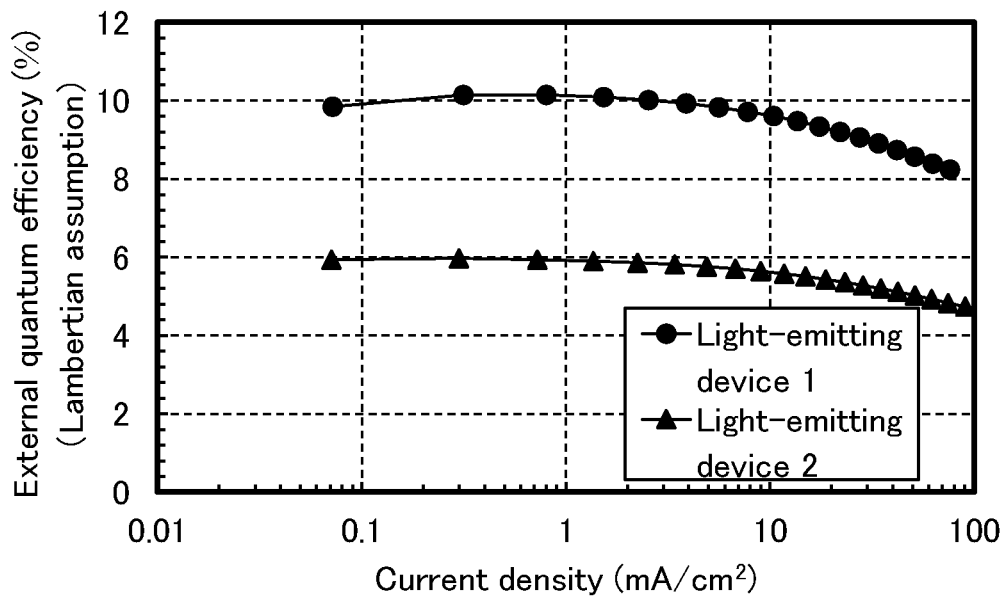
FIG. 15 shows current density-external quantum efficiency characteristics of the light-emitting device 1 and the light-emitting device 2.
Figure 16:
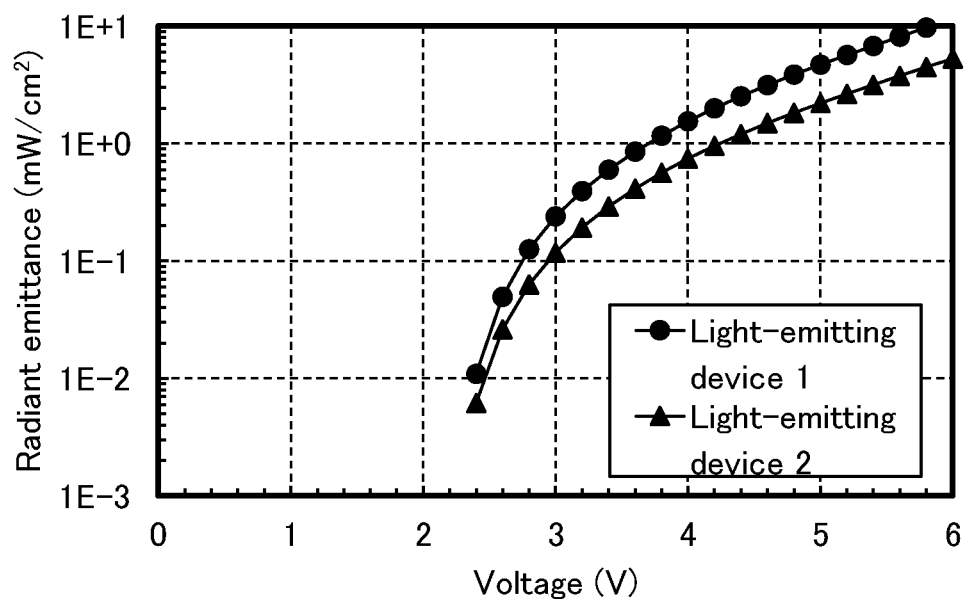
FIG. 16 shows voltage-radiant emittance characteristics of the light-emitting device 1 and the light-emitting device 2.

Operation characteristics of each of the fabricated light-emitting devices were measured. Note that the measurement was carried out at room temperature (an atmosphere maintained at 25° C.). The current density-radiant emittance characteristics of the light-emitting devices are shown in FIG. 13, the voltage-current density characteristics thereof are shown in FIG. 14, the current density-external quantum efficiency characteristics thereof are shown in FIG. 15, and the voltage-radiant emittance characteristics thereof are shown in FIG. 16. Table 3 below shows initial values of main characteristics of each of the light-emitting devices at a current density of around 10 mA/cm$^2$. Note that radiant emittance, radiant flux, and external quantum efficiency were calculated using radiance, assuming that the device had Lambertian light-distribution characteristics.

TABLE 3

| | Voltage (V) | Current (mA) | Current density (mA/cm$^2$) | Radiance (W/sr/m$^2$) | Radiant flux (mW) | External quantum efficiency (%) | Energy efficiency (%) |
| --- | --- | --- | --- | --- | --- | --- | --- |
| Light-emitting device 1 | 4.0 | 0.417 | 10.4 | 4.93 | 0.0619 | 10 | 3.7 |
| Light-emitting device 2 | 4.0 | 0.360 | 9.0 | 2.368 | 0.0298 | 5.6 | 2.1 |

Figure 17:
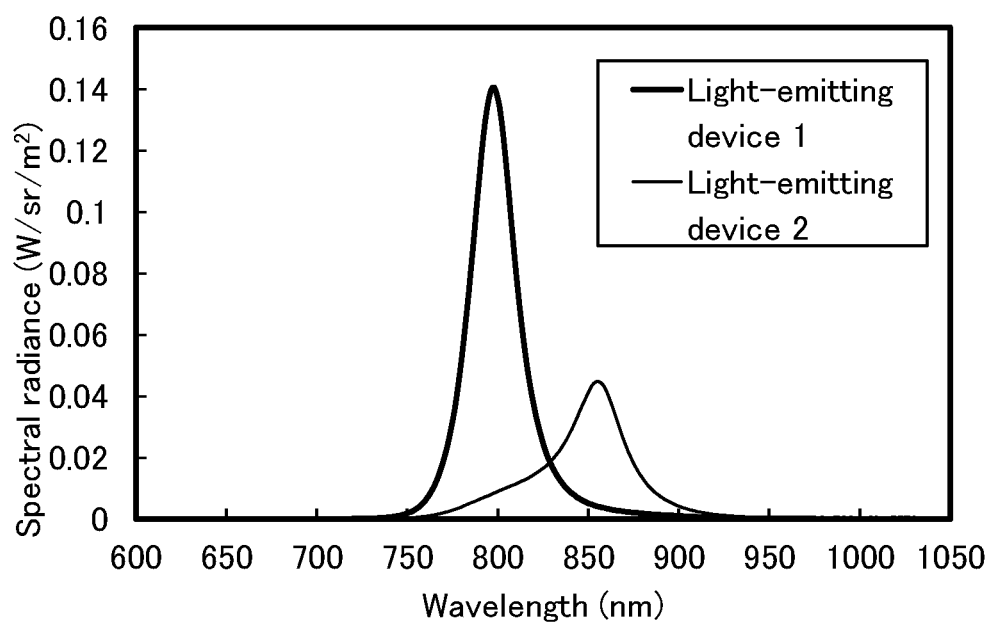
FIG. 17 shows spectral radiance of the light-emitting device 1 and the light-emitting device 2.

FIG. 17 shows EL emission spectra of the light-emitting devices to which current flows at a current density of 10 mA/cm$^2$. The emission spectra were measured with a near-infrared spectroradiometer (SR-NIR, manufactured by TOPCON TECHNOHOUSE CORPORATION).

Figure 18:
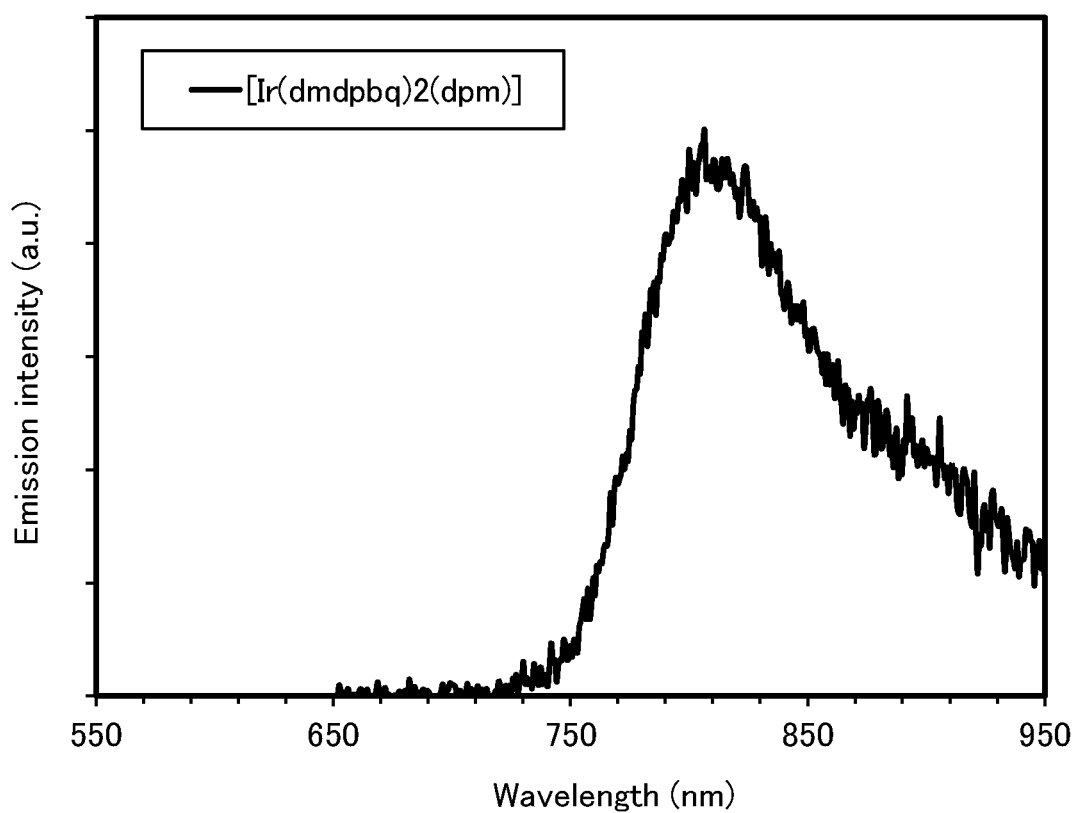
FIG. 18 shows an emission spectrum of an organometallic complex [Ir(dmdpbq)$_2$(dpm)].

In FIG. 17, although the light-emitting devices are derived from light emission of an organometallic complex [Ir(dmdpbq)$_2$(dpm)] having an emission peak wavelength of around 800 nm and included in the light-emitting layer 913, each of the light-emitting devices has an optically adjusted structure, whereby the light-emitting device 1 has an emission peak at around 800 nm and the light-emitting device 2 has an emission peak at around 855 nm, and the light-emitting devices exhibit EL emission spectra, which is narrowed due to a microcavity effect. Note that FIG. 18 shows an emission spectrum of the organometallic complex [Ir(dmdpbq)$_2$(dpm)]. The measurement of the emission spectrum was conducted at room temperature, for which an absolute PL quantum yield measurement system (C11347-01 manufactured by Hamamatsu Photonics K.K.) was used and the deoxidized dichloromethane solution (0.010 mmol/L) was put and sealed in a quartz cell under a nitrogen atmosphere.

FIG. 14 and FIG. 16 show that the light-emitting devices are driven at a low voltage. Moreover, FIG. 15 shows that the light-emitting devices emit light with high efficiency.

The light-emitting device 1 emits light with a high peak intensity and especially exhibits high emission efficiency. As described above, according to one embodiment of the present invention, a light-emitting device having a high peak intensity and exhibiting high emission efficiency can be obtained. The light-emitting device 2 exhibits an EL emission spectrum whose peak wavelength is longer than the emission peak wavelength of the organometallic complex [Ir(dmdpbq)$_2$(dpm)] included in the light-emitting layer 913. As described above, according to one embodiment of the present invention, a light-emitting device that exhibits an EL emission spectrum whose peak wavelength is longer than an emission peak wavelength of a light-emitting substance can be obtained.

Figure 19A:
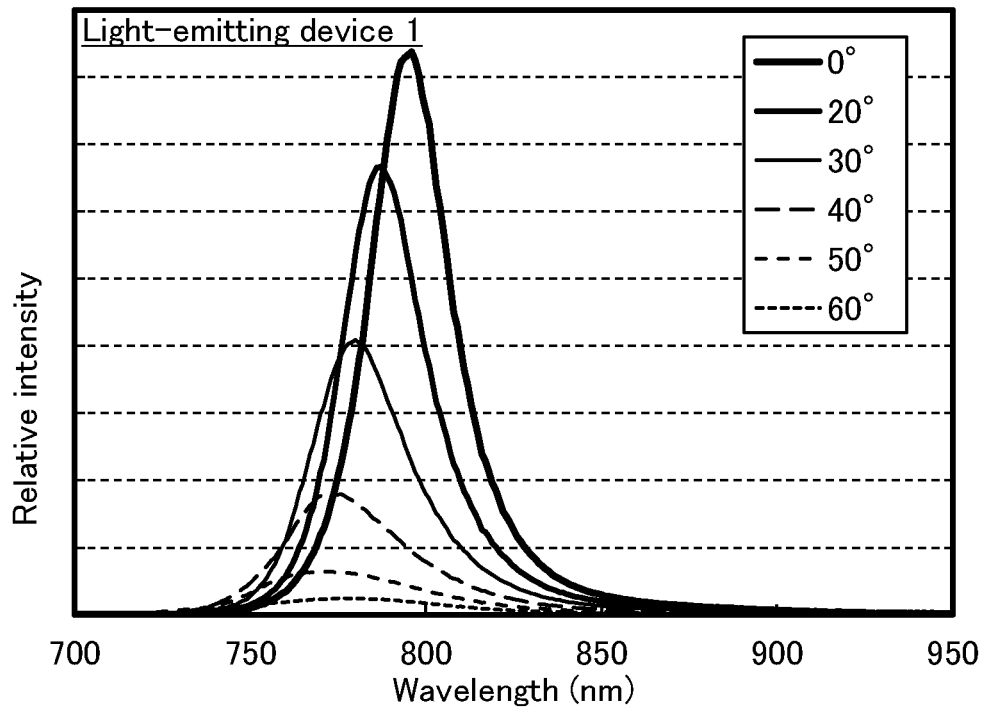
FIGS. 19A and 19B show viewing angle dependence of the light-emitting device 1 and the light-emitting device 2.
Figure 19B:
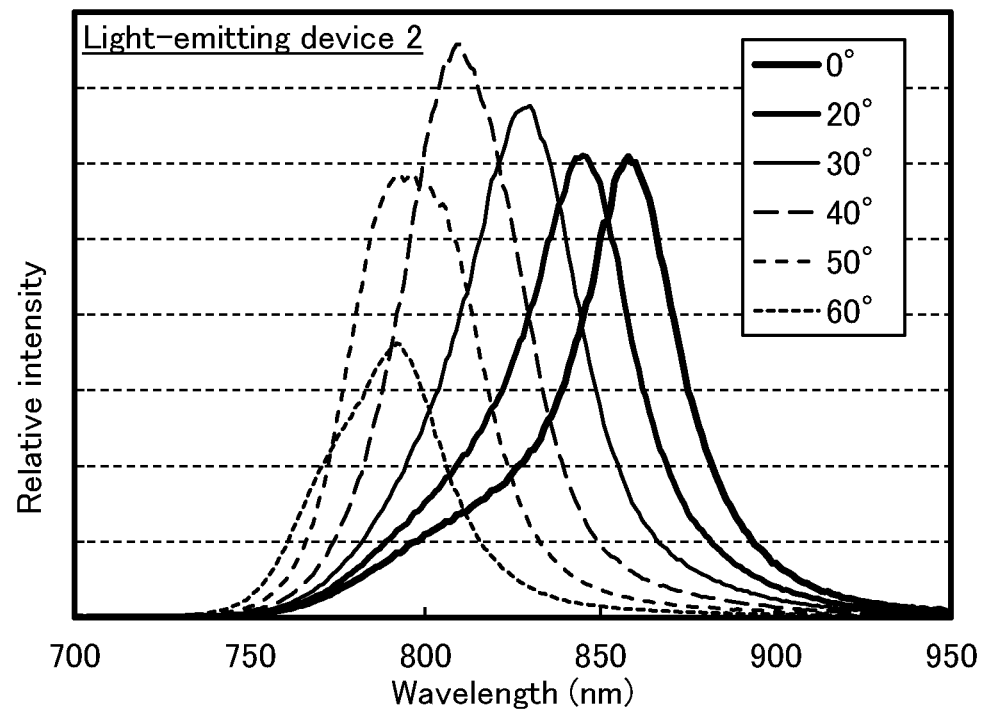

FIG. 19 shows viewing angle dependence of the EL emission spectra of the light-emitting devices to which current flows at a current density of 2.5 mA/cm³. The EL emission spectra were measured with PMA-12 (manufactured by Hamamatsu Photonics K.K.).

From FIG. 19, it was confirmed that the light-emitting device 1 tends to have the highest emission peak intensity when measured from the front surface (0°), and have a low emission peak intensity when the angle is increased from the front surface (0°) to a side surface (90°). Meanwhile, it was confirmed that the light-emitting device 2 tends to have the maximum emission peak intensity when measured not from the front surface (0°) but from an angle of 40° in a side surface direction.

When the ratio of the number of photons to Lambertian was calculated from the EL emission spectrum shown in FIG. 19, it was 39.3% in the light-emitting device 1 and 108.4% in the light-emitting device 2. By multiplying this ratio of the number of photons by the external quantum efficiency that was calculated under the assumption of Lambertian shown in Table 3, the values of the accurate external quantum efficiency in consideration of a viewing angle were 3.9% in the light-emitting device 1 and 6.1% in the light-emitting device 2. Accordingly, a relation between the external quantum efficiency that was calculated under the assumption of Lambertian and the external quantum efficiency in consideration of a viewing angle indicates that the light-emitting device 1 has a higher emission intensity from the front surface, and the light-emitting device 2 has a higher emission intensity in total luminous flux.

A refractive index of DBT3P-II used for the organic cap layer 904 was measured at room temperature with a rotating compensator variable angle fast spectroscopic ellipsometer (M-2000U) produced by J. A. Woolam. As a result, an ordinary refractive index (Ordinary) of DBT3P-II at a wavelength of 633 nm was 1.80 and an extraordinary refractive index (extraordinary) of that was 1.73.

Figure 20:
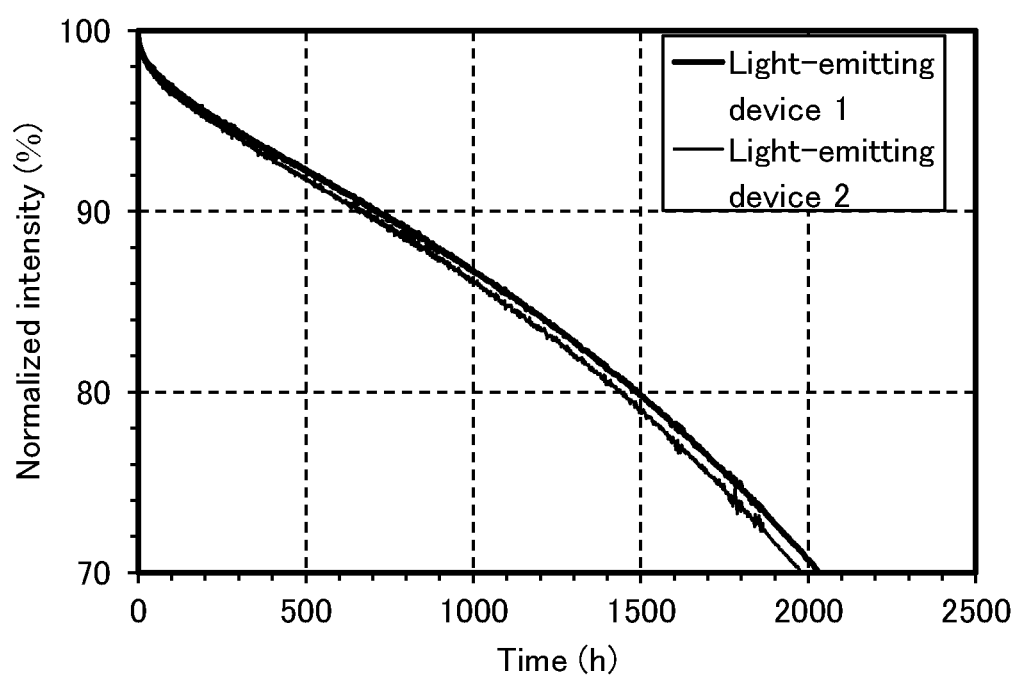
FIG. 20 shows reliability tests of the light-emitting device 1 and the light-emitting device 2.

Reliability tests were performed on the light-emitting devices 1 and 2. FIG. 20 shows the measurement results. In FIG. 20, the vertical axis represents a normalized emission intensity (%) given that the initial emission intensity is 100%, and the horizontal axis represents driving time (h) of the elements. In the reliability tests, the light-emitting devices were driven at a current density of 75 mA/cm².

The results of the reliability tests showed that the light-emitting devices 1 and 2 have high reliability. This is an effect by the use of the organometallic complex [Ir(dmdpbq)₂(dpm)], which exhibits light in a near-infrared range and has a stable excited state, for the light-emitting layers of the light-emitting devices.

Reference Synthesis Example 1

In this reference synthesis example, a method for synthesizing bis {4,6-dimethyl-2-[3-(3,5-dimethylphenyl)-2-benzo[g]quinoxalinyl-κN]phenyl-κC}(2,2,6,6-tetramethyl-3,5-heptanedionato-κ²O,O')iridium(III) (abbreviation: [Ir(dmdpbq)₂(dpm)]) that is the organometallic complex used in Example 1 will be described.

[Chemical Formula 6]

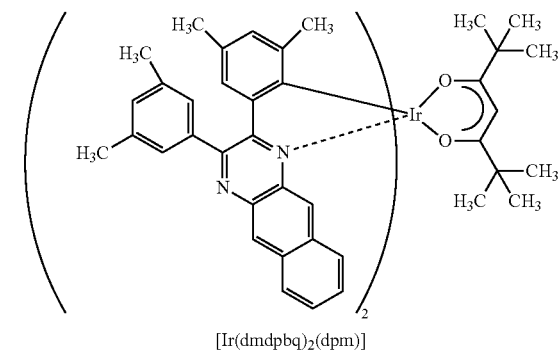

[Ir(dmdpbq)₂(dpm)]

Step 1; Synthesis of 2,3-bis-(3,5-dimethylphenyl)-2-benzo[g]quinoxaline (Abbreviation: Hdmdpbq)

First, Hdmdpbq was synthesized. Into a three-necked flask equipped with a reflux pipe, 3.20 g of 3,3',5,5'-tetramethylbenzyl, 1.97 g of 2,3-diaminonaphthalene, and 60 mL of ethanol were put, the air in the flask was replaced with nitrogen, and then the mixture was stirred at 90° C. for 7.5 hours. After a predetermined time elapsed, the solvent was distilled off. Then, purification by silica gel column chromatography using toluene as a developing solvent was performed, whereby the target substance was obtained (a yellow solid, yield: 3.73 g, percent yield: 79%). The synthesis scheme of Step 1 is shown in (a-1).

[Chemical Formula 7]

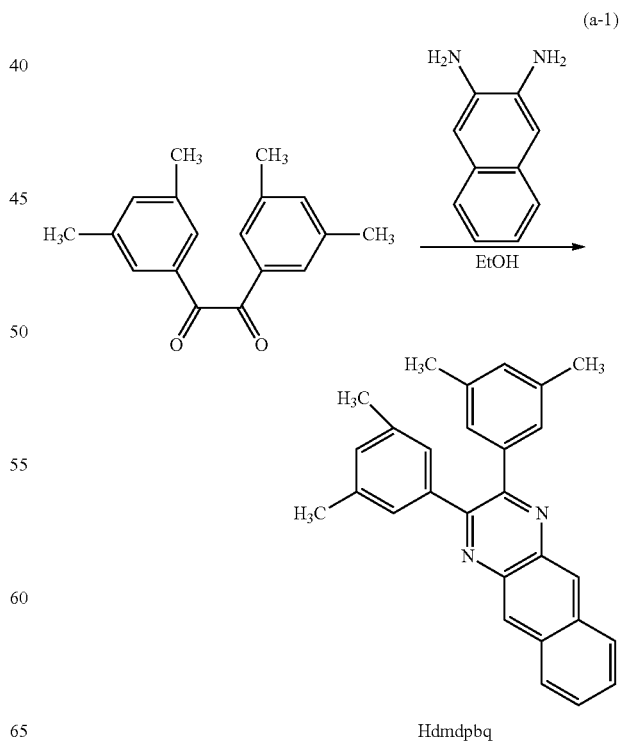

Hdmdpbq

Analysis results by nuclear magnetic resonance spectroscopy ($^1$H-NMR) of the yellow solid obtained in Step 1 are shown below. The results reveal that Hdmdpbq was obtained.

Given below is $^1$H NMR data of the obtained substance.
$^1$H-NMR. δ (CD$_2$Cl$_2$): 2.28 (s, 12H), 7.01 (s, 2H), 7.16 (s, 4H), 7.56-7.58 (m, 2H), 8.11-8.13 (m, 2H), 8.74 (s, 2H).

Step 2; Synthesis of di-μ-chloro-tetrakis{4,6-dimethyl-2-[3-(3,5-dimethylphenyl)-2-benzo[g]quinoxalinyl-κN]phenyl-κC}diiridium(III) (Abbreviation: [Ir(dmdpbq)$_2$Cl]$_2$)

Next, 15 mL of 2-ethoxyethanol, 5 mL of water, 1.81 g of Hdmdpbq obtained in Step 1, and 0.66 g of iridium chloride hydrate (IrCl$_3$H$_2$O) (produced by Furuya Metal Co., Ltd.) were put into a recovery flask equipped with a reflux pipe, and the air in the flask was replaced with argon. Then, microwave irradiation (2.45 GHz, 100 W) was performed for 2 hours to cause reaction. After a predetermined time elapsed, the obtained residue was suction-filtered and washed with methanol, whereby the target substance was obtained (a black solid, yield: 1.76 g, percent yield: 81%). The synthesis scheme of Step 2 is shown in (a-2).

Step 3; Synthesis of [Ir(dmdpbq)$_2$(dpm)]

Next, 20 mL of 2-ethoxyethanol, 1.75 g of [Ir(dmdpbq)$_2$Cl]$_2$ obtained in Step 2, 0.50 g of dipivaloylmethane (abbreviation: Hdpm), and 0.95 g of sodium carbonate were put into a recovery flask equipped with a reflux pipe, and the air in the flask was replaced with argon. Then, microwave irradiation (2.45 GHz, 100 W) was performed for 3 hours.

The obtained residue was suction-filtered with methanol and then washed with water and methanol. The obtained solid was purified by silica gel column chromatography using dichloromethane as a developing solvent, and then recrystallization was performed with a mixed solvent of dichloromethane and methanol, whereby the target substance was obtained (a dark green solid, yield: 0.42 g, percent yield: 21%). With a train sublimation method, 0.41 g of the obtained dark green solid was purified by sublimation. The conditions of the sublimation purification were such that the dark green solid was heated under a pressure of 2.7 Pa at 300° C. while the argon gas flowed at a flow rate of 10.5 mL/min. After the sublimation purification, a dark green solid was obtained in a yield of 78%. The synthesis scheme of Step 3 is shown in (a-3).

[Chemical Formula 8]

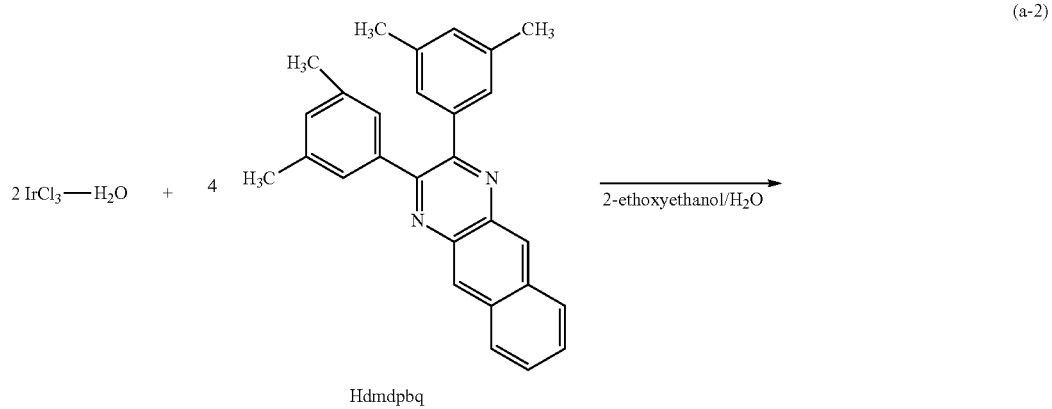

(a-2)

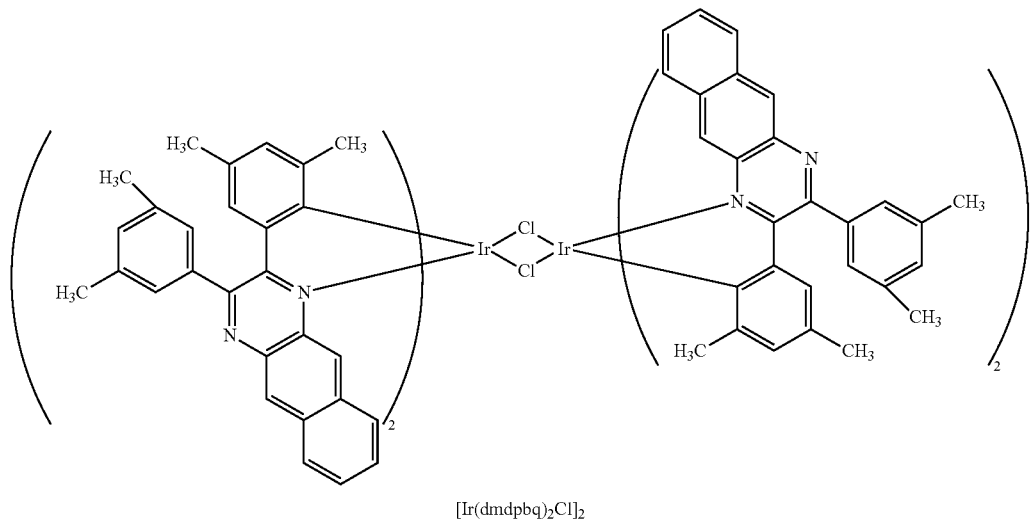

[Chemical Formula 9]

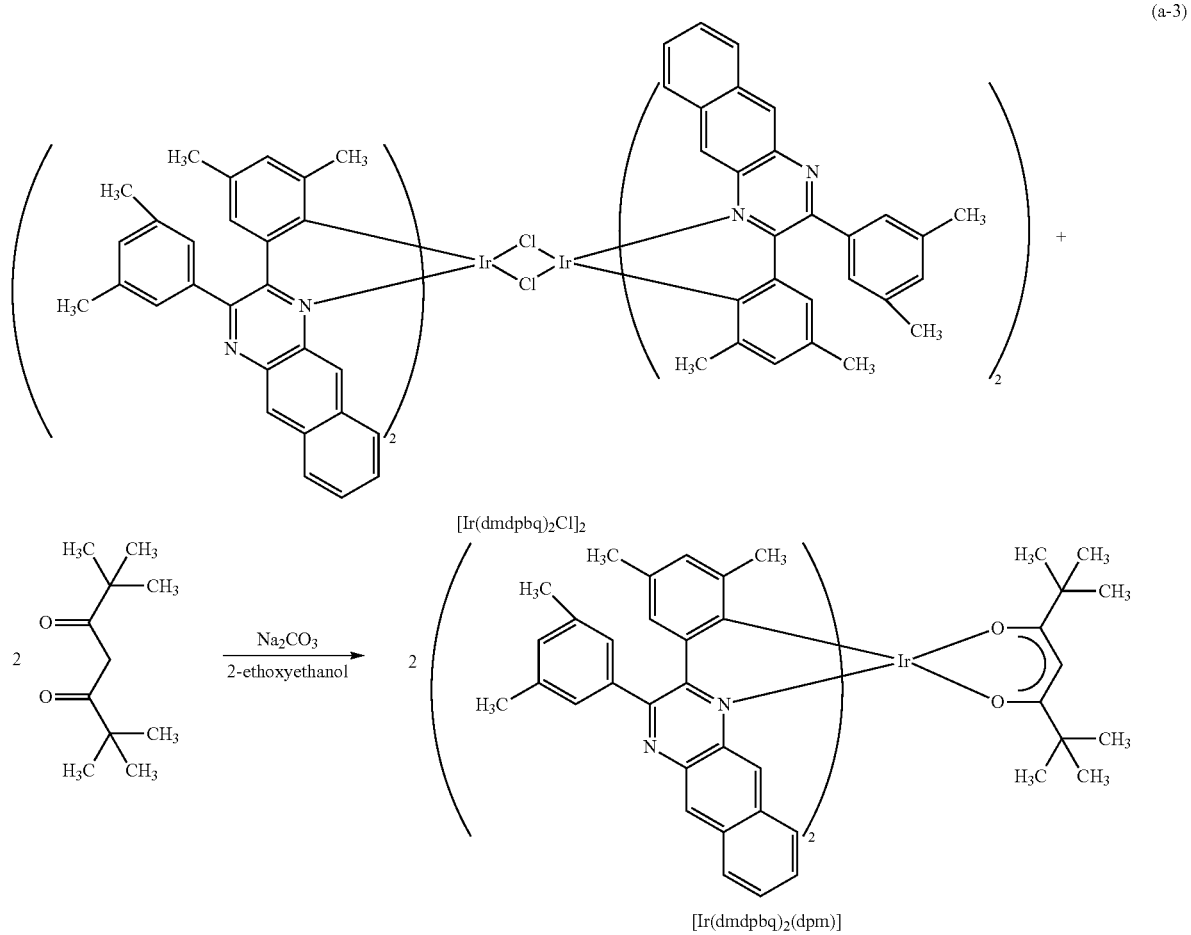

Analysis results of analysis by nuclear magnetic resonance spectroscopy ($^1$H-NMR) of the dark green solid obtained in Step 3 are shown below. The results indicate that [Ir(dmdpbq)$_2$(dpm)] was obtained.

Given below is $^1$H NMR data of the obtained substance.

$^1$H-NMR. δ (CD$_2$Cl$_2$): 0.75 (s, 18H), 0.97 (s, 6H), 2.01 (s, 6H), 2.52 (s, 12H), 4.86 (s, 1H), 6.39 (s, 2H), 7.15 (s, 2H), 7.31 (s, 2H), 7.44-7.51 (m, 4H), 7.80 (d, 2H), 7.86 (s, 4H), 8.04 (d, 2H), 8.42 (s, 2H), 8.58 (s, 2H).

REFERENCE NUMERALS

101: first electrode, 102: second electrode, 103: EL layer, 103a, 103b: EL layer, 104: charge-generation layer, 105: organic cap layer, 111, 111a, 111b: hole-injection layer, 112, 112a, 112b: hole-transport layer, 113, 113a, 113b: light-emitting layer, 114, 114a, 114b: electron-transport layer, 115, 115a, 115b: electron-injection layer, 200R, 200G, 200B: optical path length, 201: first substrate, 202: transistor (FET), 203R, 203G, 203B, 203W: light-emitting device, 204: EL layer, 205: second substrate, 206R, 206G, 206B: color filter, 206R', 206G', 206B': color filter, 207: first electrode, 208: second electrode, 209: black layer (black matrix), 210R, 210G: conductive layer, 301: first substrate, 302: pixel portion, 303: driver circuit portion (source line driver circuit), 304a, 304b: driver circuit portion (gate line driver circuit), 305: sealant, 306: second substrate, 307: lead wiring, 308: FPC, 309: FET, 310: FET, 311: FET, 312: FET, 313: first electrode, 314: insulator, 315: EL layer, 316: second electrode, 317: light-emitting device, 318: space, 900: substrate, 901: first electrode, 902: EL layer, 903: second electrode, 904: organic cap layer, 911: hole-injection layer, 912: hole-transport layer, 913: light-emitting layer, 914: electron-transport layer, 915: electron-injection layer, 4000: lighting device, 4001: substrate, 4002: light-emitting device, 4003: substrate, 4004: first electrode, 4005: EL layer, 4006: second electrode, 4007: electrode, 4008: electrode, 4009: auxiliary wiring, 4010: insulating layer, 4011: sealing substrate, 4012: sealant, 4013: desiccant, 4200: lighting device, 4201: substrate, 4202: light-emitting device, 4204: first electrode, 4205: EL layer, 4206: second electrode, 4207: electrode, 4208: electrode, 4209: auxiliary wiring, 4210: insulating layer, 4211: sealing substrate, 4212: sealant, 4213: barrier film, 4214: planarization film, 5101: light, 5102: wheel, 5103: door, 5104: display portion, 5105: steering wheel, 5106: shifter, 5107: seat, 5108: inner rearview mirror, 5109: windshield, 7000: housing, 7001: display portion, 7002: second display portion, 7003: speaker, 7004: LED lamp, 7005: operation key, 7006: connect terminal, 7007: sensor, 7008: microphone, 7009: switch, 7010: infrared port, 7011: recording medium reading portion, 7014: antenna, 7015: shutter button, 7016: image receiving portion, 7018:

stand, 7022, 7023: operation button, 7024: connection terminal, 7025: band, 7026: microphone, 7029: sensor, 7030: speaker, 7052, 7053, 7054: information, 9310: portable information terminal, 9311: display portion, 9312: display region, 9313: hinge, 9315: housing

The invention claimed is:

1. A light-emitting device comprising an EL layer between a first electrode and a second electrode,
    wherein the first electrode is a reflective electrode and the second electrode is a semi-transmissive and semi-reflective electrode,
    wherein the EL layer emits light having an emission peak in a wavelength range from 750 nm to 1000 nm, and
    wherein reflectance of one or both of the first electrode and the second electrode with respect to light with a wavelength of 850 nm is higher than the reflectance thereof with respect to light with a wavelength of 500 nm.

2. The light-emitting device according to claim 1,
    wherein the second electrode has a thickness greater than or equal to 20 nm and less than or equal to 60 nm.

3. The light-emitting device according to claim 1, further comprising:
    an organic layer that is in contact with the second electrode and sandwiches the second electrode with the EL layer,
    wherein the organic layer has a refractive index of greater than or equal to 1.7.

4. The light-emitting device according to claim 3,
    wherein a thickness of the organic layer is greater than or equal to 80 nm and less than or equal to 160 nm.

5. The light-emitting device according to claim 1,
    wherein at least one of the first electrode and the second electrode comprises at least one of gold (Au), silver (Ag), and copper (Cu).

6. The light-emitting device according to claim 1,
    wherein the reflectance of the first electrode with respect to light with a wavelength of 850 nm is higher than or equal to 90%.

7. The light-emitting device according to claim 1,
    wherein the reflectance of the second electrode with respect to light with a wavelength of 850 nm is higher than or equal to 90%.

8. A light-emitting apparatus comprising:
    the light-emitting device according to claim 1; and
    an FPC.

9. An electronic device comprising:
    the light-emitting apparatus according to claim 8; and
    at least one of a microphone, a camera, an operation button, an external connection portion, and a speaker.

10. A lighting device comprising:
    the light-emitting device according to claim 1; and
    at least one of a housing and a cover.

11. A light-emitting device comprising an EL layer between a first electrode and a second electrode,
    wherein the first electrode is a reflective electrode and the second electrode is a semi-transmissive and semi-reflective electrode,
    wherein the EL layer comprises a light-emitting substance having an emission peak in a wavelength range from 750 nm to 1000 nm, and
    wherein a peak of emission spectrum of light emitted from the EL layer has longer wavelength than the emission peak of the light-emitting substance.

12. The light-emitting device according to claim 11,
    wherein at least one of the first electrode and the second electrode comprises at least one of gold (Au), silver (Ag), and copper (Cu).

13. The light-emitting device according to claim 11,
    wherein the reflectance of the first electrode with respect to light with a wavelength of 850 nm is higher than or equal to 90%.

14. The light-emitting device according to claim 11,
    wherein the reflectance of the second electrode with respect to light with a wavelength of 850 nm is higher than or equal to 90%.

15. The light-emitting device according to claim 11,
    wherein the light-emitting substance is a phosphorescent substance.

16. The light-emitting device according to claim 11,
    wherein the light-emitting substance is an organometallic complex represented by General Formula (G1):

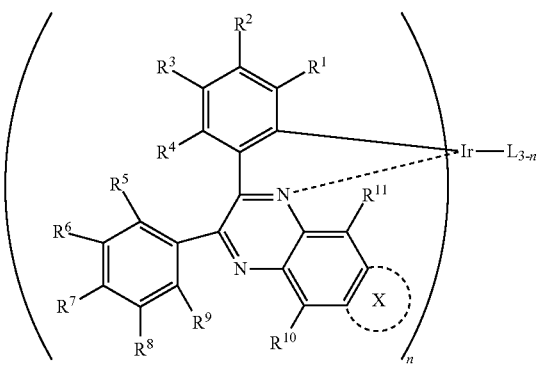

wherein:
each of $R^1$ to $R^{11}$ independently represents hydrogen or an alkyl group having 1 to 6 carbon atoms,
at least two of $R^1$ to $R^4$ represent an alkyl group having 1 to 6 carbon atoms,
at least two of $R^5$ to $R^9$ represent an alkyl group having 1 to 6 carbon atoms,
X represents a substituted or unsubstituted benzene ring or naphthalene ring, and
n is 2 or 3; and L represents a monoanionic ligand.

17. A light-emitting apparatus comprising:
the light-emitting device according to claim 11; and
an FPC.

18. An electronic device comprising:
the light-emitting apparatus according to claim 17; and
at least one of a microphone, a camera, an operation button, an external connection portion, and a speaker.

19. A lighting device comprising:
the light-emitting device according to claim 11; and
at least one of a housing and a cover.

* * * * *